(12) United States Patent
Jao et al.

(10) Patent No.: US 12,532,498 B2
(45) Date of Patent: Jan. 20, 2026

(54) SEMICONDUCTOR DEVICE WITH REVERSE-CUT SOURCE/DRAIN CONTACT STRUCTURE AND METHOD THEREOF

(71) Applicant: Taiwan Semiconductor Manufacturing Company, Ltd., Hsinchu (TW)

(72) Inventors: Meng-Huan Jao, Taichung (TW); Lin-Yu Huang, Hsinchu (TW); Huan-Chieh Su, Changhua County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 799 days.

(21) Appl. No.: 17/892,864

(22) Filed: Aug. 22, 2022

(65) Prior Publication Data
US 2023/0420566 A1  Dec. 28, 2023

Related U.S. Application Data

(60) Provisional application No. 63/356,397, filed on Jun. 28, 2022.

(51) Int. Cl.
*H10D 30/62* (2025.01)
*H10D 30/01* (2025.01)
(Continued)

(52) U.S. Cl.
CPC ....... *H10D 30/6211* (2025.01); *H10D 30/024* (2025.01); *H10D 30/6219* (2025.01);
(Continued)

(58) Field of Classification Search
CPC ............ H10D 30/6211; H10D 30/024; H10D 30/6219; H10D 84/013; H10D 84/0158; H10D 84/038
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

OTHER PUBLICATIONS

Meng-Huan Jao et al., Process and Structure for Source/Drain Contacts, U.S. Appl. No. 17/338,384, filed Jun. 3, 2021, Assignee: Taiwan Semiconductor Manufacturing Company, Ltd., 26 pages specification 32 pages drawings.

*Primary Examiner* — Christine A Enad
(74) *Attorney, Agent, or Firm* — HAYNES AND BOONE, LLP

(57) ABSTRACT

A method includes providing a structure having gate structures, source/drain electrodes, a first etch stop layer (ESL), a first interlayer dielectric (ILD) layer, a second ESL, and a second ILD layer. The method includes forming a first etch mask; performing a first etching to the second ILD layer, the second ESL, and the first ILD layer through the first etch mask to form first trenches; depositing a third dielectric layer into the first trenches; forming a second etch mask; and performing a second etching to the second ILD layer, the second ESL, the first ILD layer, and the first ESL through the second etch mask, thereby forming second trenches, wherein the second trenches expose some of the source/drain electrodes, and the third dielectric layer resists the second etching. The method further includes depositing a metal layer into the second trenches.

20 Claims, 44 Drawing Sheets

(51) Int. Cl.
  *H10D 84/01* (2025.01)
  *H10D 84/03* (2025.01)
  *H10D 84/83* (2025.01)

(52) U.S. Cl.
  CPC ....... *H10D 84/013* (2025.01); *H10D 84/0158* (2025.01); *H10D 84/038* (2025.01); *H10D 84/834* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,633,999 B1 | 4/2017 | Lu et al. |
| 10,535,654 B2 | 1/2020 | Tsai et al. |
| 11,404,570 B2 | 8/2022 | Chang et al. |
| 2018/0190780 A1* | 7/2018 | Lee ................... H10D 84/038 |
| 2022/0344486 A1* | 10/2022 | Chang ............... H10D 84/0135 |
| 2024/0282698 A1* | 8/2024 | Chang ................ H01L 23/5226 |
| 2025/0157938 A1* | 5/2025 | Tsai .................. H01L 23/53257 |

* cited by examiner

SEMICONDUCTOR DEVICE WITH REVERSE-CUT SOURCE/DRAIN CONTACT STRUCTURE AND METHOD THEREOF

PRIORITY

The present application claims the benefits of and priority to U.S. Provisional Application No. 63/356,397, filed Jun. 28, 2022, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when the scaling down continues, isolation among adjacent source/drain (S/D) contacts becomes a concern. Methods and structures for increasing isolation among adjacent S/D contacts are highly desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
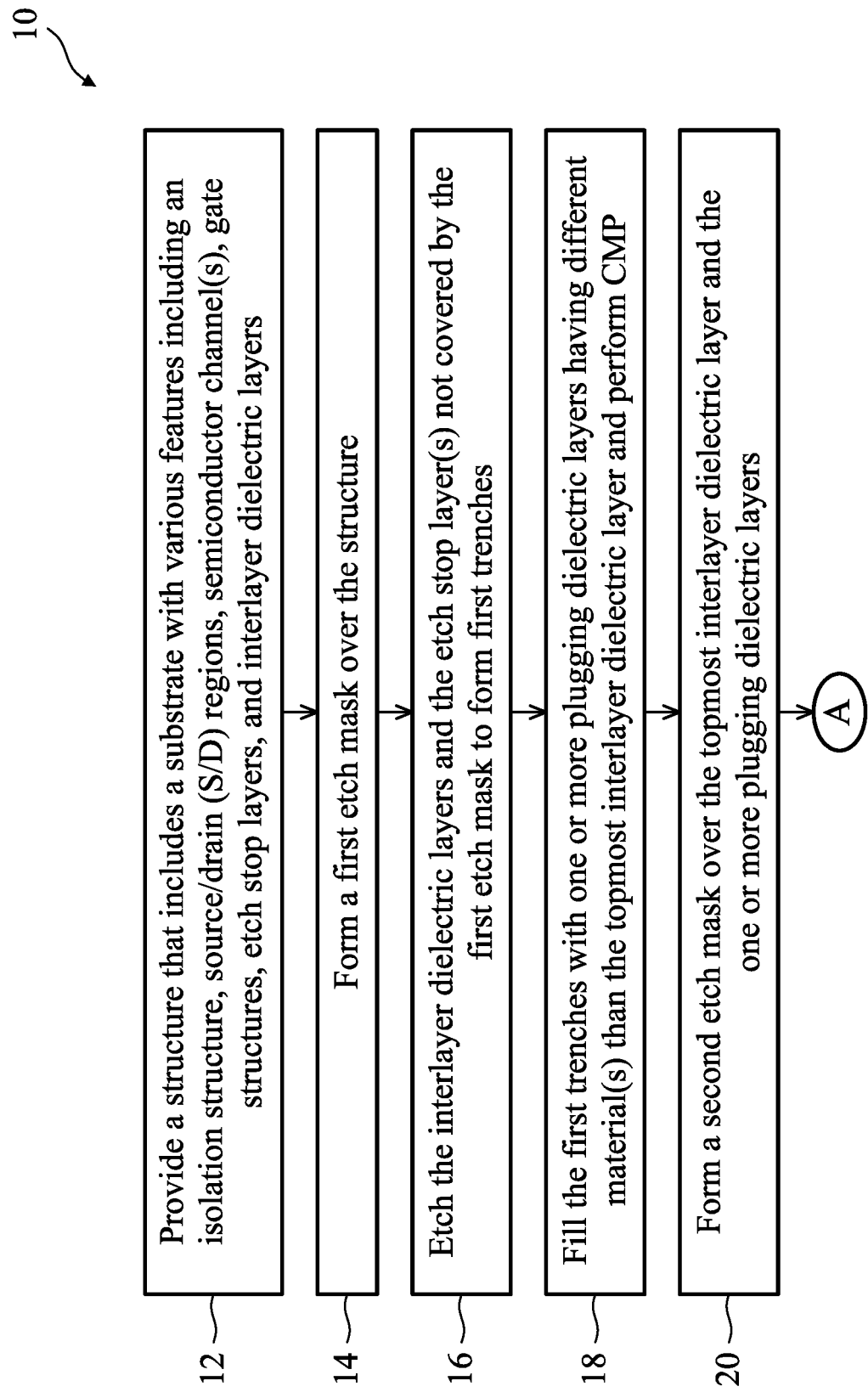
FIGS. 1A and 1B show a flow chart of a method of forming a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and manufacturing methods, and more particularly to source/drain (S/D) contacts and formation methods thereof. In the present disclosure, source/drain (S/D) may refer to a source or a drain of a transistor, individually or collectively dependent upon the context. Source/drain contacts refer to metallic contacts or metal compounds that land on S/D electrodes or regions. Forming S/D contacts generally includes a variety of processes. One of the processes is to etch a dielectric layer over the S/D electrodes through an etch mask so that the S/D electrodes can be exposed for making connection to the S/D contacts. The etching of the dielectric layer may be anisotropic or isotropic. Sometimes, portions of the etch mask may be narrow, such as equal to or close to the critical dimension (CD) of the fabrication process, and these narrow portions of the etch mask may be peeled off before or during the etching process. Consequently, two contact holes may be accidentally merged into one, and two S/D contacts may be accidentally shorted. The present disclosure solves the above and other problems by using a process that includes forming one or more plugging dielectric layers in places where S/D contacts are designed to be separated, forming a patterned mask, and performing an etching process to form S/D contact holes by using the patterned mask and the one or more plugging dielectric layers collectively as the etch mask. Due to the existence of the one or more plugging dielectric layers, the S/D contacts are safely isolated from each other according to design.

The disclosed methods and structures can be applied to ICs having FinFETs, gate-all-around (GAA) transistors, or other types of transistors. GAA transistors refer to transistors having gate stacks (which include gate electrodes and gate dielectric layers) surrounding transistor channels, such as vertically stacked gate-all-around horizontal nanowire or nanosheet MOSFET devices. The various aspects of the present disclosure will be further discussed with reference to FIGS. 2A-14C, which illustrate an example IC having FinFETs. Those of ordinary skill in the art should appreciate that they may readily use the present disclosure as a basis for designing or modifying other structures (such as ICs having GAA transistors) for carrying out the same purposes and/or achieving the same advantages of the embodiments introduced herein.

Figure 1B:
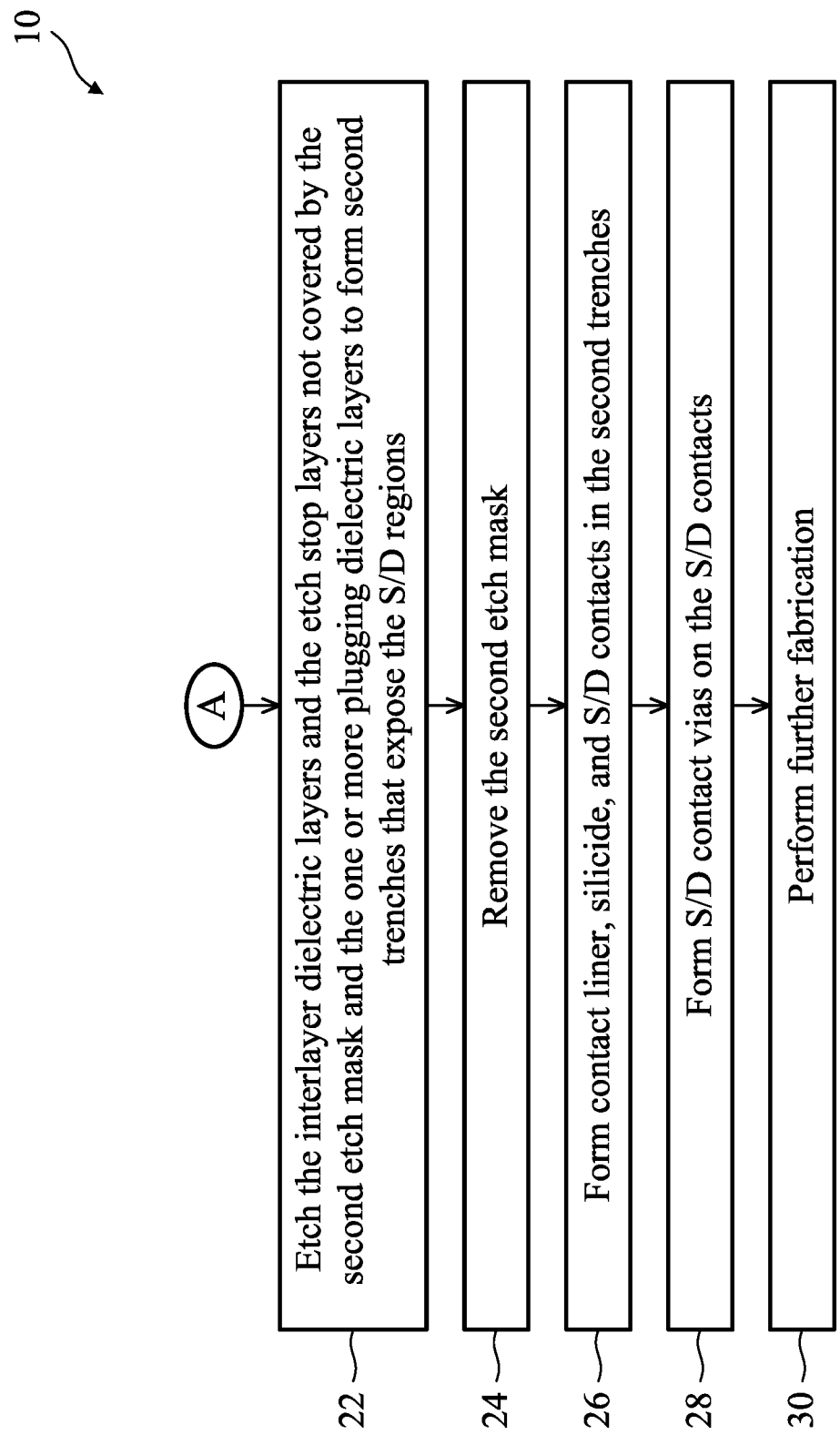

FIGS. 1A and 1B show a flow chart of a method 10 of forming a semiconductor device 200 (or a semiconductor structure 200), according to various aspects of the present disclosure. The method 10 is merely an example and is not intended to limit the present disclosure beyond what is explicitly recited in the claims. Additional operations can be provided before, during, and after the method 10, and some operations described can be replaced, eliminated, or relocated for additional embodiments of the method. Method 10 is described below in conjunction with FIGS. 2A-14C which illustrate portions of the semiconductor device 200 in various stages of a manufacturing process. Particularly, FIGS. 2A, 3A, 4A, 5A, 6A, 7A, 8A, 9A, 10A, 11A, 12A, 13A, and 14A are top views of a portion of the semiconductor device 200; FIGS. 2B, 3B, 4B, 5B, 6B, 7B, 8B, 9B, 10B, 11B, 12B, 13B, and 14B are cross-sectional views of the portion of the semiconductor device 200 along the "B-B" line of FIGS. 2A through 14A respectively, and FIGS. 2C, 3C, 4C, 5C, 6C, 7C, 8C, 9C, 10C, 11C, 12C, 13C, and 14C are cross-sectional views of the portion of the semiconductor device 200 along the "C-C" line of FIGS. 2A through 14A respectively. The "B-B" line is along a channel length (or gate length, Lg) direction, and the "C-C" line is perpendicular to the channel length direction.

The semiconductor device 200 is provided for illustration purposes and does not necessarily limit the embodiments of the present disclosure to any number of devices, any number of regions, or any configuration of structures or regions. Furthermore, the semiconductor device 200 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs and gate-all-around devices, metal-oxide semiconductor field effect transistors (MOSFETs), complementary metal-oxide semiconductor (CMOS) transistors, bipolar transistors, high voltage transistors, high frequency transistors, other memory cells, and combinations thereof. The semiconductor device 200 is shown in FIGS. 2A through 14C as having FinFETs. In alternative embodiments, the semiconductor device 200 may have GAA or other types of transistors. FIGS. 2A through 14C have been simplified for the sake of clarity to better understand the inventive concepts of the present disclosure. Additional features can be added in the semiconductor device 200, and some of the features described below can be replaced, modified, or eliminated in other embodiments of the semiconductor device 200.

Figure 2A:
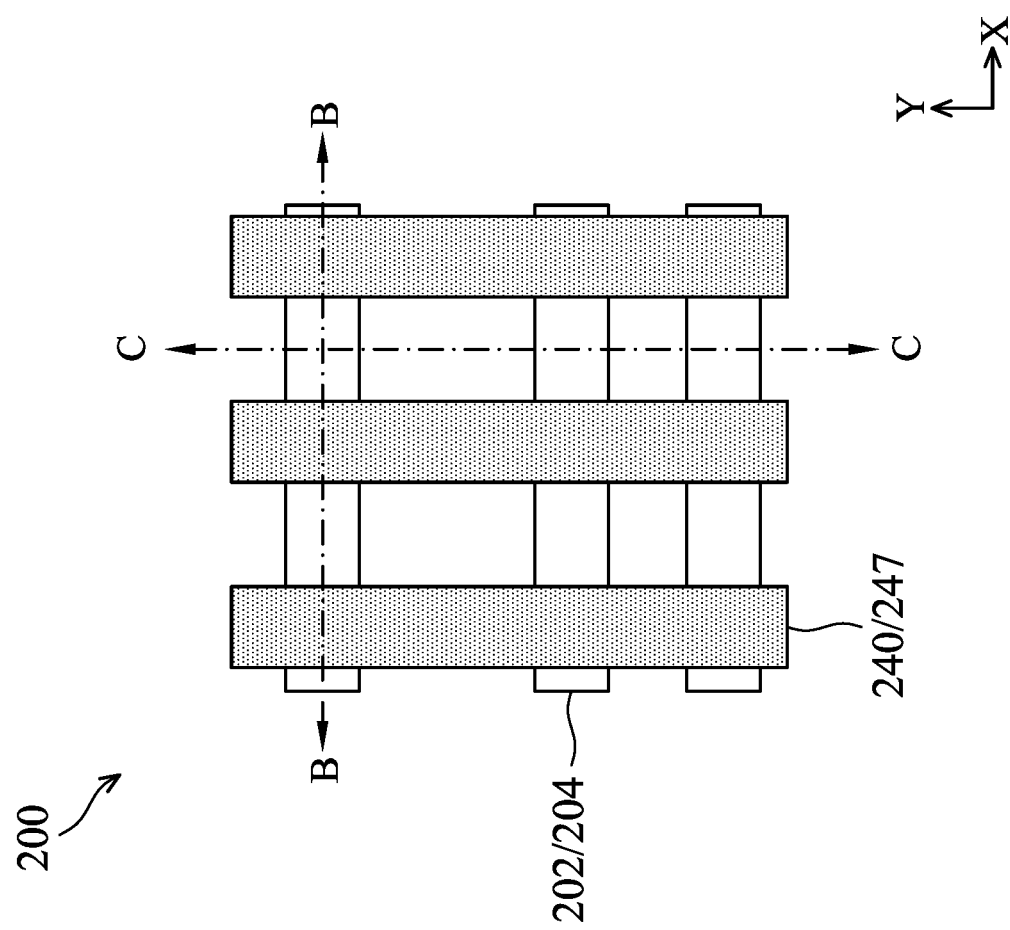
FIGS. 2A, 3A, 4A, 5A, 6A, 7A, 8A, 9A, 10A, 11A, 12A, 13A, and 14A are top views of a portion of a semiconductor device during various manufacturing stages according to the method in FIGS. 1A and 1B in accordance with embodiments of the present disclosure.
Figure 2B:
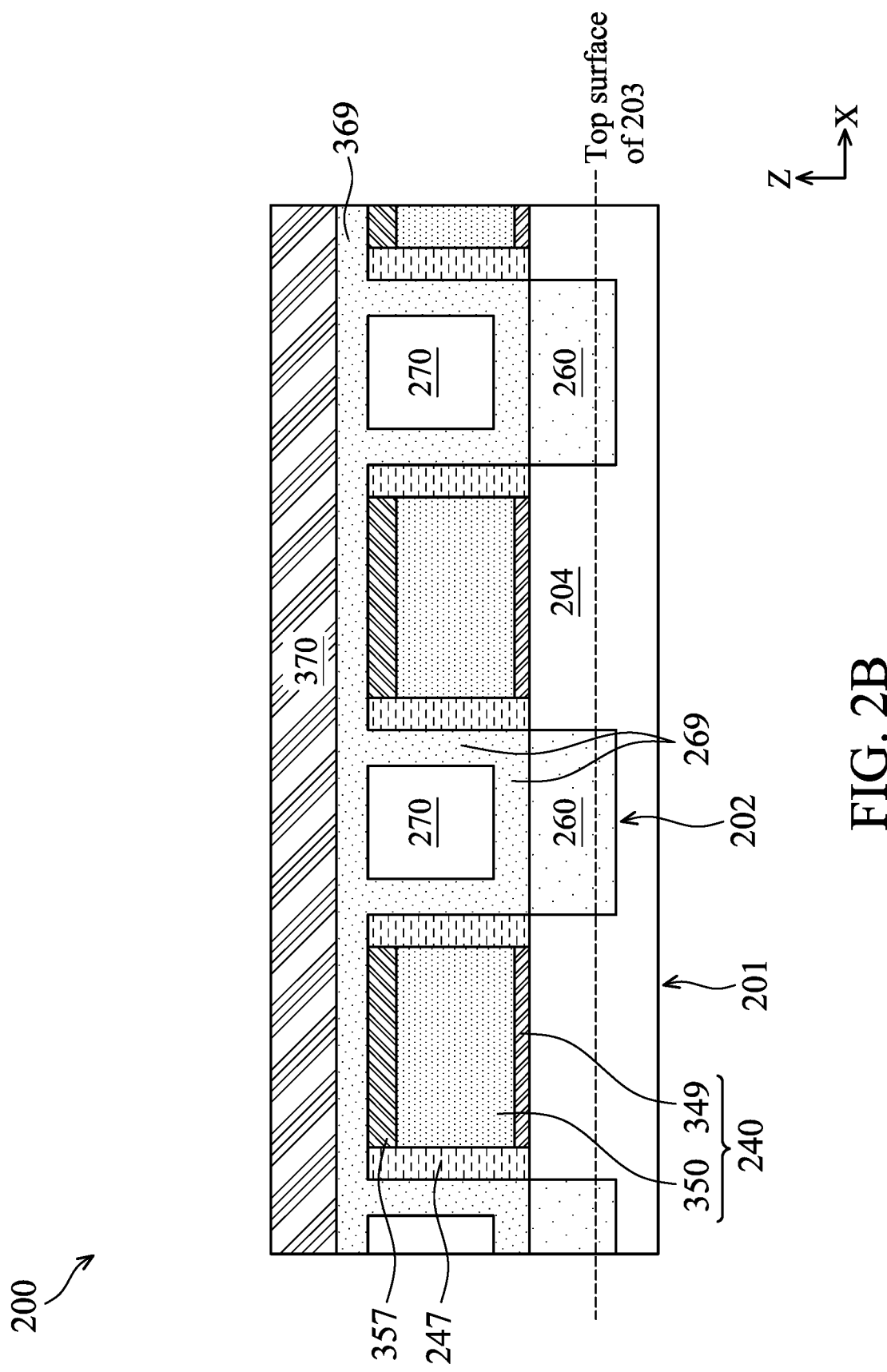
FIGS. 2B, 3B, 4B, 5B, 6B, 7B, 8B, 9B, 10B, 11B, 12B, 13B, and 14B are cross-sectional views of a portion of the semiconductor device along the B-B line of FIGS. 2A through 14A, respectively, during various manufacturing stages according to the method in FIGS. 1A and 1B in accordance with embodiments of the present disclosure.
Figure 2C:
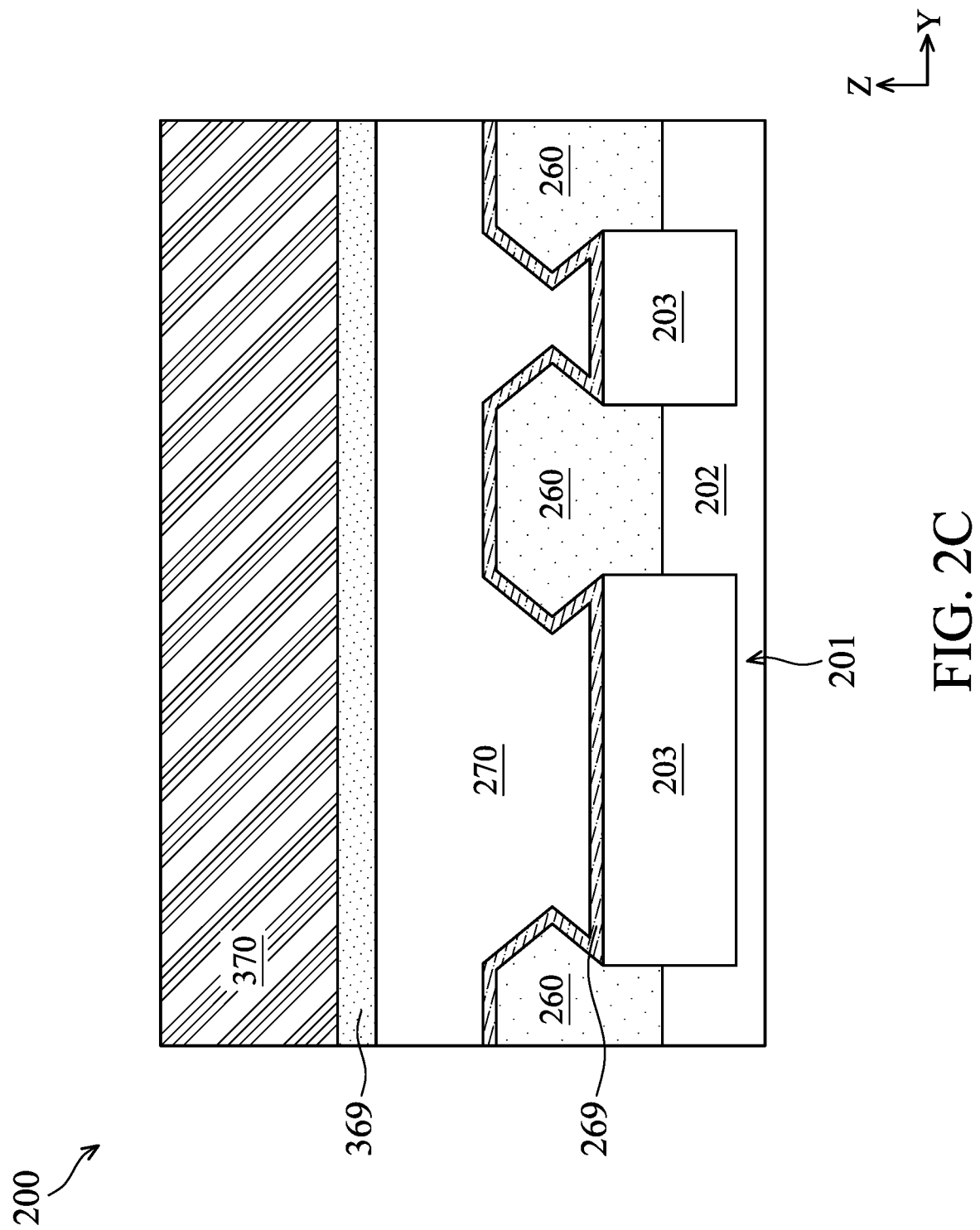
FIGS. 2C, 3C, 4C, 5C, 6C, 7C, 8C, 9C, 10C, 11C, 12C, 13C, and 14C are cross-sectional views of a portion of the semiconductor device along the C-C line of FIGS. 2A through 14A, respectively, during various manufacturing stages according to the method in FIGS. 1A and 1B in accordance with embodiments of the present disclosure.

At operation 12, the method 10 (FIG. 1A) provides an intermediate structure of the semiconductor device 200, an embodiment of which is shown in FIGS. 2A-2C. Referring to FIGS. 2A-2C, the semiconductor device 200 includes a substrate 201 and various features built in or on the substrate 201. In the depicted embodiment, the semiconductor device 200 includes semiconductor fins 202 protruding from the substrate 201 and S/D electrodes 260 disposed over the semiconductor fins 202. The semiconductor fins 202 extend lengthwise along the "X" direction. The semiconductor fin 202 includes channel regions 204, each of which connects two S/D electrodes 260 and serves as a transistor channel. The semiconductor device 200 further includes an isolation structure 203 (such as shallow trench isolation (STI)) to isolate active regions, such as semiconductor fins 202, from each other. In an alternative embodiment where the transistors are GAA transistors, the channel region 204 includes multiple semiconductor channels vertically stacked. The semiconductor device 200 further includes gate structures 240 over the channel regions 204, and gate spacers 247 on sidewalls of the gate structures 240. The gate structures 240 are disposed above the isolation structure 203 and on three sides of the channel regions 204. In the depicted embodiment, the semiconductor device 200 further includes a gate cap 357 on top of the gate structures 240, a first etch stop layer (ESL) 269, a first interlayer dielectric (ILD) layer 270, a second ESL 369, a second ILD layer 370. These elements are further described below.

In an embodiment, the substrate 201 is a bulk silicon substrate (i.e., including bulk single-crystalline silicon). The substrate 201 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, substrate 201 is a semiconductor-on-insulator substrate, such as a silicon-on-insulator (SOI) substrate, a silicon germanium-on-insulator (SGOI) substrate, or a germanium-on-insulator (GOI) substrate.

The semiconductor fins 202 may include one or more layers of semiconductor materials such as silicon or silicon germanium. The semiconductor fins 202 may be formed by any suitable method. For example, the semiconductor fins 202 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the semiconductor fins 202. For example, the masking element may be used for etching recesses into semiconductor layers over or in the substrate 201, leaving the semiconductor fins 202 on the substrate 201.

The isolation structure 203 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 203 is formed by etching trenches in or over the substrate 201 (e.g., as part of the process of forming the semiconductor fins 202), filling the trenches with an insulating material, and performing a chemical mechanical planarization (CMP) process and/or an etching back process to the insulating material, leaving the remaining insulating material as the isolation structure 203. Other types of isolation structure may also be suitable, such as field oxide and LOCal Oxidation of Silicon (LOCOS). The isolation structure 203 may include a multi-layer structure, for example, having one or more liner layers (e.g., silicon nitride) on surfaces of the substrate 201 and the semiconductor fins 202 and a main isolating layer (e.g., silicon dioxide) over the one or more liner layers.

The S/D electrodes 260 include epitaxially grown semiconductor materials such as epitaxially grown silicon, germanium, or silicon germanium. The S/D electrodes 260 can be formed by any epitaxy processes including chemical vapor deposition (CVD) techniques (for example, vapor phase epitaxy and/or Ultra-High Vacuum CVD), molecular beam epitaxy, other suitable epitaxial growth processes, or combinations thereof. The S/D electrodes 260 may be doped with n-type dopants and/or p-type dopants. In some embodiments, for n-type transistors, the S/D electrodes 260 include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the S/D electrodes 260 include silicon germanium or germanium, and can be doped with boron, other p-type dopant, or combinations thereof (for example, forming Si:Ge:B epitaxial S/D features). The S/D electrodes 260 may include multiple epitaxial semiconductor layers having different levels of dopant density. In some embodiments, annealing processes (e.g., rapid thermal annealing (RTA) and/or laser annealing) are performed to activate dopants in the epitaxial S/D electrodes 260. The top surface of the S/D electrodes 260 may be flat in some embodiment and may not be flat in some other embodiments.

In the depicted embodiment, each gate structure 240 includes a gate dielectric layer 349 and a gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$(BTO), $(Ba,Sr)TiO_3$ (BST), hafnium dioxide-alumina ($HfO_2$-$Al_2O_3$) alloy, other suitable high-k dielectric material, or combinations thereof. The gate dielectric layer 349 may be formed by chemical oxidation, thermal oxidation, atomic layer deposition (ALD), chemical vapor deposition (CVD), and/or other suitable methods. In some embodiments, each gate structure 240 further includes an interfacial layer between the gate dielectric layer 349 and the channel region 204. The interfacial layer may include silicon dioxide, silicon oxynitride, or other suitable materials. In some embodiments, the gate electrode 350 includes an n-type or a p-type work function metal layer and a metal fill layer. For example, an n-type work function metal layer may comprise a metal with sufficiently low effective work function such as titanium, aluminum, tantalum carbide, tantalum carbide nitride, tantalum silicon nitride, or combinations thereof. For example, a p-type work function metal layer may comprise a metal with a sufficiently large effective work function, such as titanium nitride, tantalum nitride, ruthenium, molybdenum, tungsten, platinum, or combinations thereof. For example, the metal fill layer may include aluminum, tungsten, cobalt, copper, and/or other suitable materials. The gate electrode 350 may be formed by CVD, PVD, plating, and/or other suitable processes. Since the gate structures 240 include a high-k dielectric layer and metal layer(s), they are also referred to as high-k metal gates.

In some embodiments, the gate spacers 247 include a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In embodiments, the gate spacers 247 may include $La_2O_3$, $Al_2O_3$, ZnO, ZrN, $Zr_2Al_3O_9$, $TiO_2$, $TaO_2$, $ZrO_2$, $HfO_2$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate 240) and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structure 240. In embodiments, the gate spacers 247 may have a thickness of about 1 nm to about 40 nm, for example.

In some embodiments, the gate cap 357 may include tungsten (W), cobalt (Co), ruthenium (Ru), other suitable metals, or combinations thereof, and may be formed by CVD, PVD, ALD. The gate cap 357 may have a thickness of about 1 nm to about 4 nm in some embodiments. In an embodiment, the top surfaces of the gate cap 357 and the gate spacer 247 are substantially coplanar. In some embodiments, the gate cap 357 is omitted.

The ESL 269 is on sidewalls of the gate spacers 247 and over the S/D electrodes 260. The ILD layer 270 is over the ESL 269 and fills the space between adjacent gate structures 240 and S/D electrodes 260. In some embodiments, the ESL 269 has a conformal shape, i.e., it has a substantially uniform thickness over the underlying structures including the isolation structure 203, the S/D electrodes 260, and the gate spacers 247. In an embodiment, the top surface of the gate cap 357, or the top surface of the gate structure 240 if the gate cap 357 is omitted, is substantially coplanar with the topmost surface of the ESL 269 and the ILD layer 270. The ESL 369 is disposed over the top surfaces of the gate cap 357, or the top surface of the gate structure 240 if the gate cap 357 is omitted, the gate spacers 247, the ESL 269, and the ILD layer 270. The ILD layer 370 is disposed over the ESL 369. In embodiments, each of the ESLs 269 and 369 may include $Si_3N_4$, SiCN, SiC, SiOC, SiOCN, $HfO_2$, $ZrO_2$, $ZrAlO_x$, $HfAlO_x$, $HfSiO_x$, $Al_2O_3$, or other suitable material(s); and may be formed by CVD, PVD, ALD, or other suitable methods. In embodiments, each of the ILD layers 270 and 370 may comprise tetraethylorthosilicate (TEOS) formed oxide (e.g., reacting TEOS with oxygen using CVD to deposit silicon oxide), un-doped silicate glass, or doped silicon oxide such as borophosphosilicate glass (BPSG), FSG, phosphosilicate glass (PSG), boron doped silicon glass (BSG), a low-k dielectric material, other suitable dielectric material, or combinations thereof. Each of the ILD layers 270 and 370 may be formed by PECVD (plasma enhanced CVD), FCVD (flowable CVD), or other suitable methods.

Figure 3A:
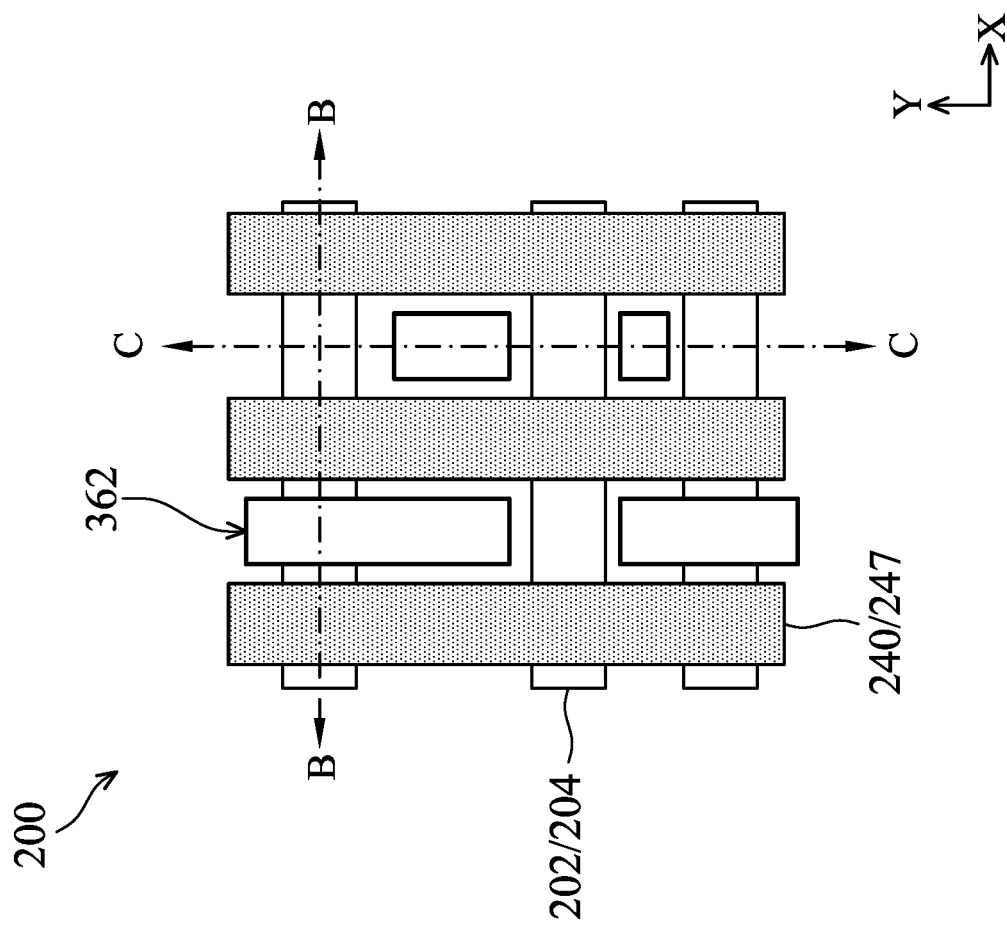
Figure 3B:
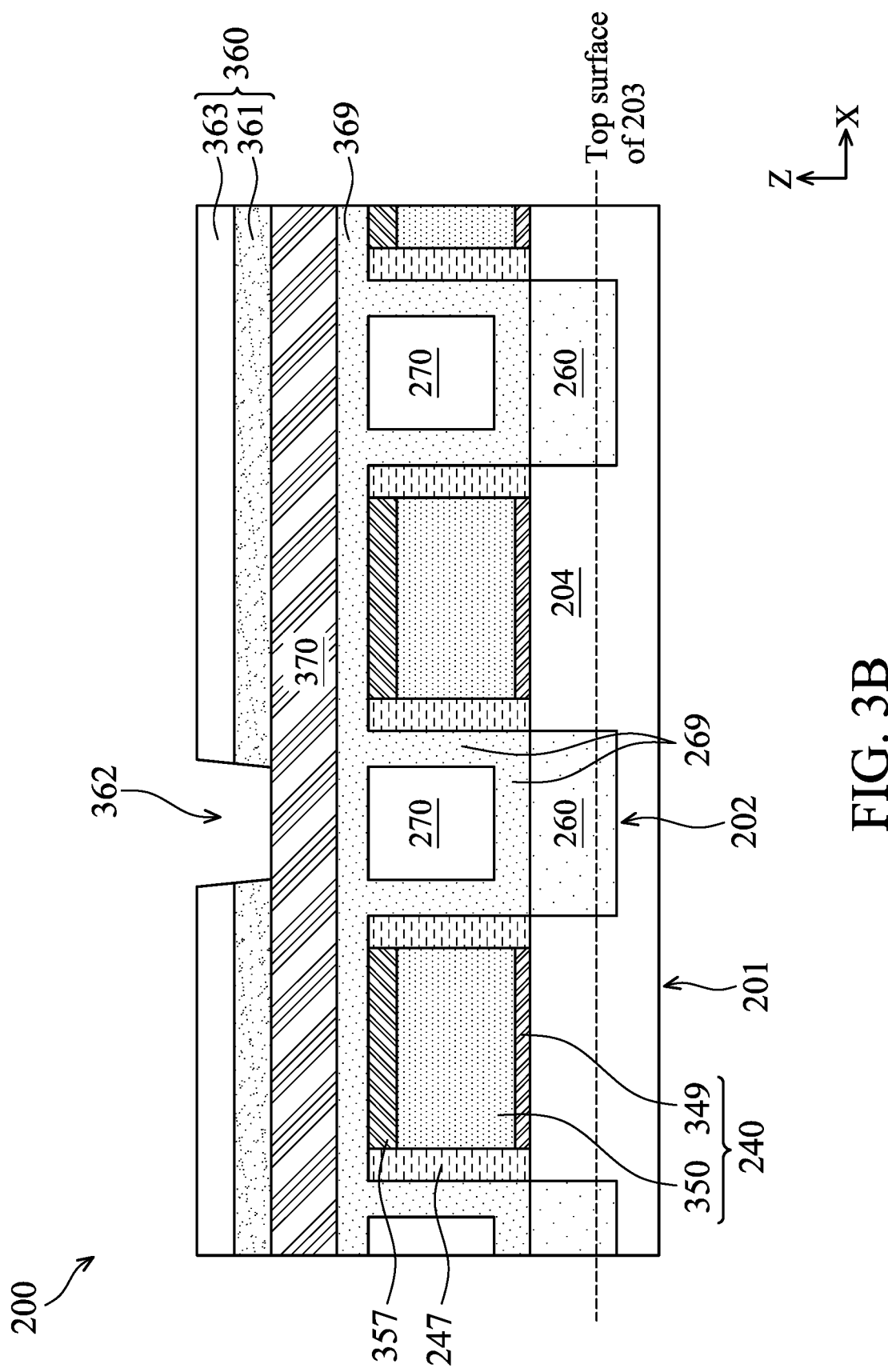
Figure 3C:
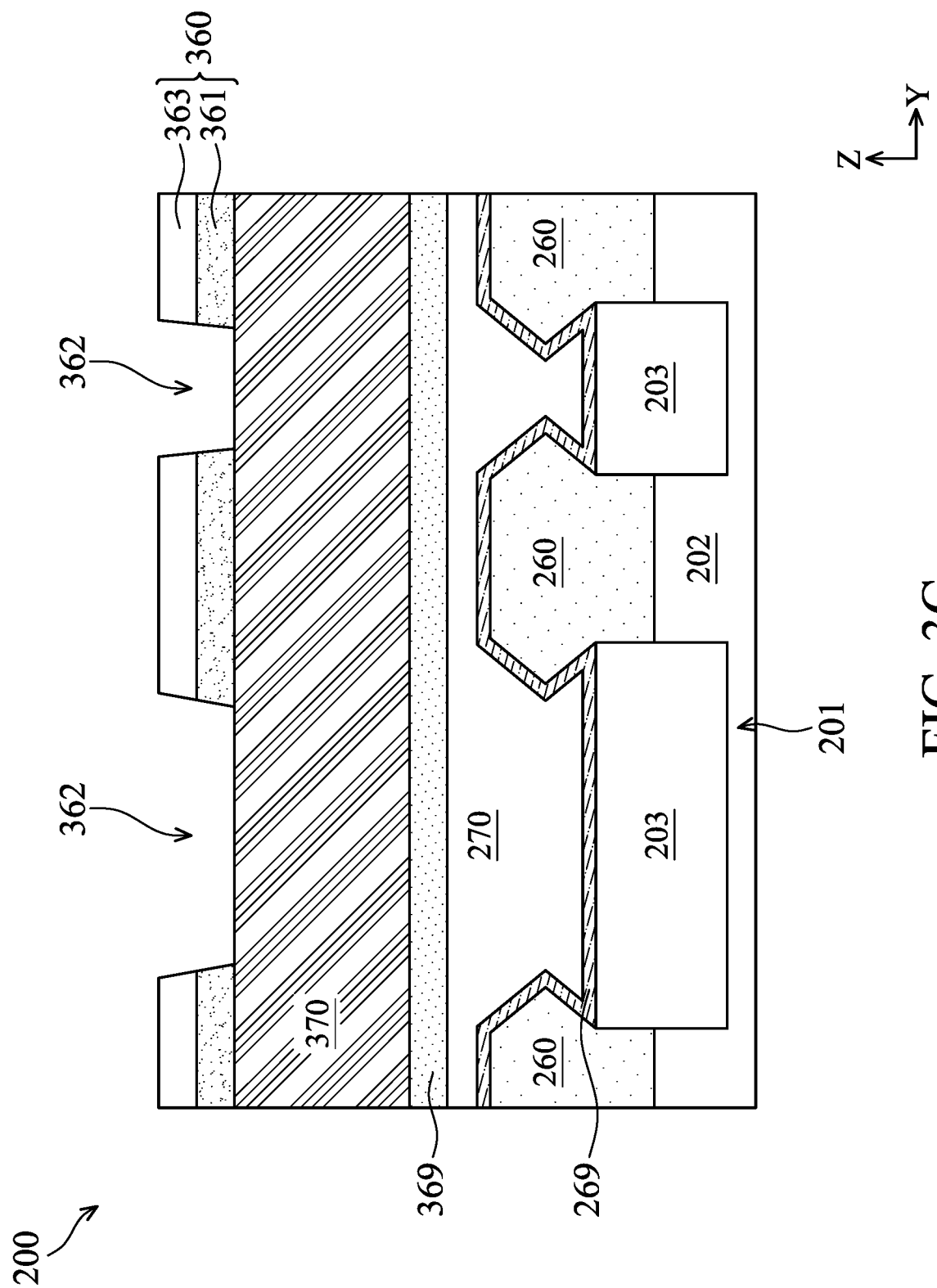

At operation 14, the method 10 (FIG. 1A) forms an etch mask 360 over the semiconductor device 200, such as shown in FIGS. 3A-3C. The etch mask 360 includes a resist (or photoresist) layer 363 over a hard mask layer 361. The hard mask layer 361 may include nitrogen-free anti-reflection layer (NFARL), carbon-doped silicon dioxide (e.g., $SiO_2$:C), titanium nitride (TiN), titanium oxide ($TiO_2$), boron nitride (BN), and/or other suitable material. Operation 14 includes a variety of processes including deposition, photolithography, and etching processes. For example, operation 14 may deposit the hard mask layer 361 over the semiconductor device 200 and spin-coat a resist layer 363 on the hard mask layer 361. Then, operation 14 performs a photolithography process that includes exposing the resist layer 363 to radiation energy (e.g., DUV light or EUV light) and developing the exposed resist layer 363 in a developing solution. After development, the resist layer 363 is patterned into a resist pattern (referred to as a resist pattern 363) that provides various openings 362. The openings 362 are directly above areas where one or more plugging dielectric layers 273 (FIGS. 5A-C) are to be formed. The hard mask layer 361 is then etched through the openings 362 to result in a patterned hard mask (referred to as a hard mask pattern 361). In some embodiments, the resist pattern 363 is removed after the hard mask pattern 361 is formed.

Figure 4A:
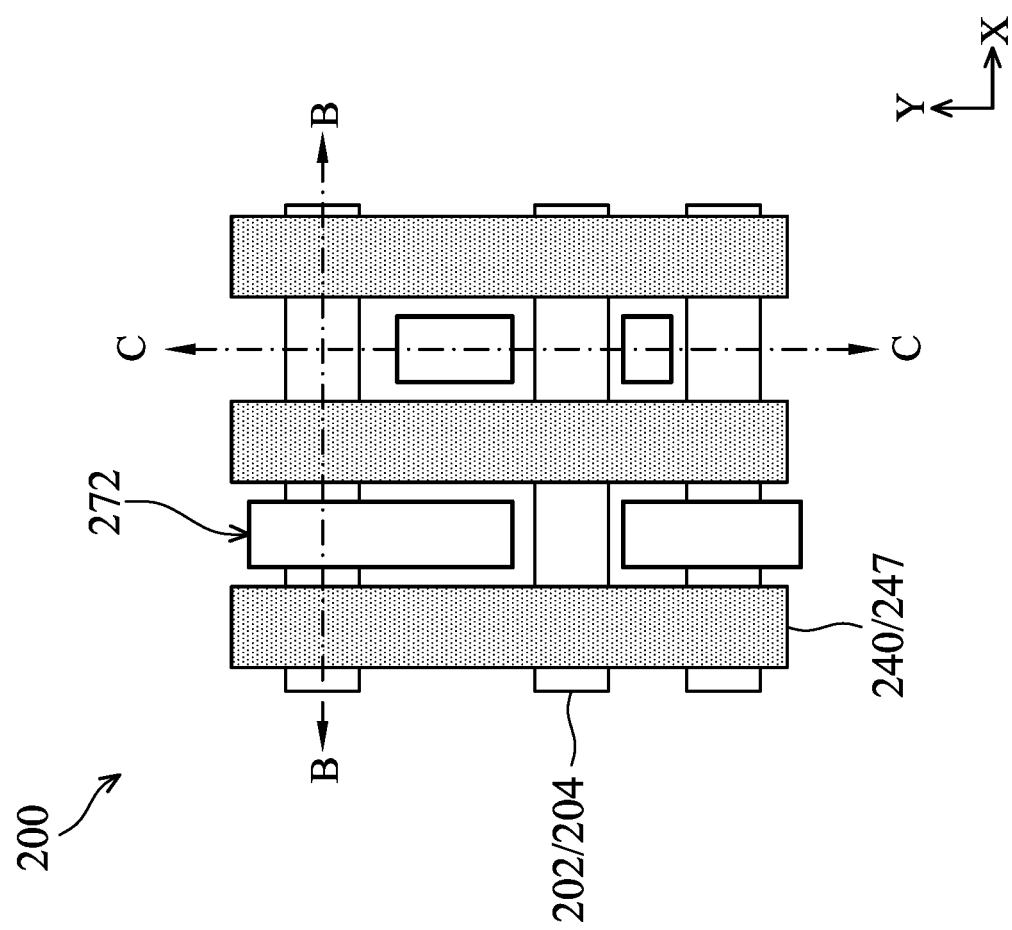
Figure 4B:
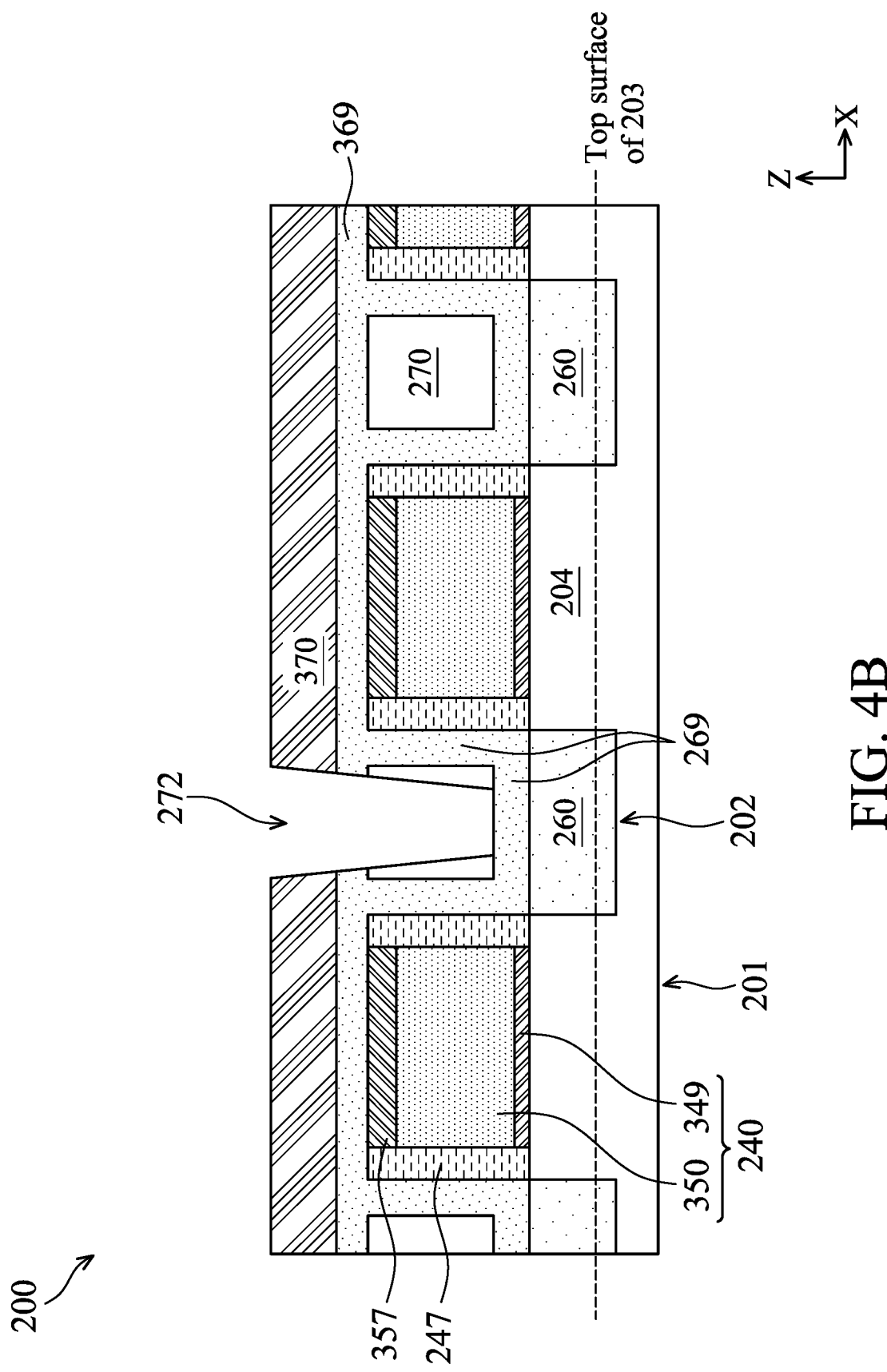
Figure 4C:
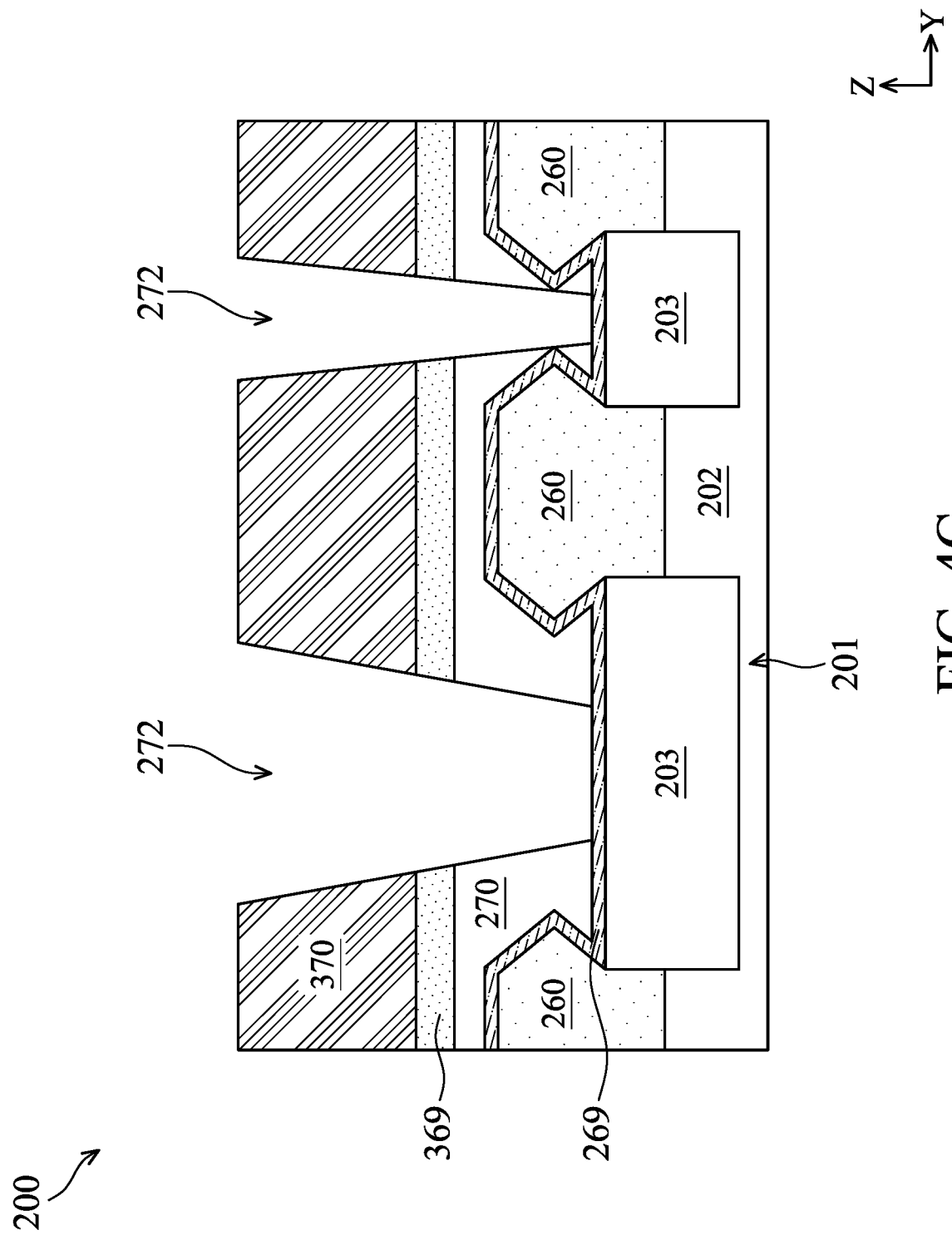

At operation 16, with the etch mask 360 (either the hard mask pattern 361 or both the hard mask pattern 361 and the resist pattern 363) in place, the method 10 (FIG. 1A) etches the semiconductor device 200 to form trenches 272, as shown in FIGS. 4A-4C. In an embodiment, operation 16 applies one or more etching processes to the semiconductor device 200. Further, the one or more etching processes are tuned selective to the materials of the ILD layers 370 and 270 and the ESLs 369 and 269. The etch mask 360 may be partially consumed during the etching processes. In an embodiment, any remaining portions of the etch mask 360 may be removed after the trenches 272 are formed. In an alternative embodiment, any remaining portions of the etch mask 360 may be kept after the trenches 272 are formed and are subsequently removed in a CMP process that polishes the one or more plugging dielectric layers 273 (see FIGS. 5A-5C). The depth of the trenches 272 may vary in various embodiments. For example, in the embodiment depicted in FIGS. 4B-4C, the trenches 272 reach and expose the ESL 269, and may partially go into the ESL 269. In an alternative embodiment depicted in FIGS. 10B-10C, the trenches 272 (where the dielectric plugs 273 are formed) do not reach the ESL 269 and stop in the ILD 270. In another alternative embodiment depicted in FIGS. 12B-12C, the trenches 272 (where the dielectric plugs 273 are formed) completely go through the ESL 269 and expose the S/D electrodes 260 and/or the isolation structure 203. Further, the trenches 272 are formed with tapered sidewalls. The sidewall angles will be described when discussing FIGS. 9A-9C. Still further, the sidewalls of the trenches 272 may or may not be flat in various embodiments depending on the materials of the of the ILD layers 370 and 270 and the ESLs 369 and 269 as well as the etchant(s) being used. For example, when a single etching process is used to etch the ILD layers 370 and 270 and the ESLs 369 and 269, the sidewalls of the trenches 272 may not be flat due to the different materials in the ILD layers 370 and 270 and the ESLs 369 and 269.

Figure 5A:
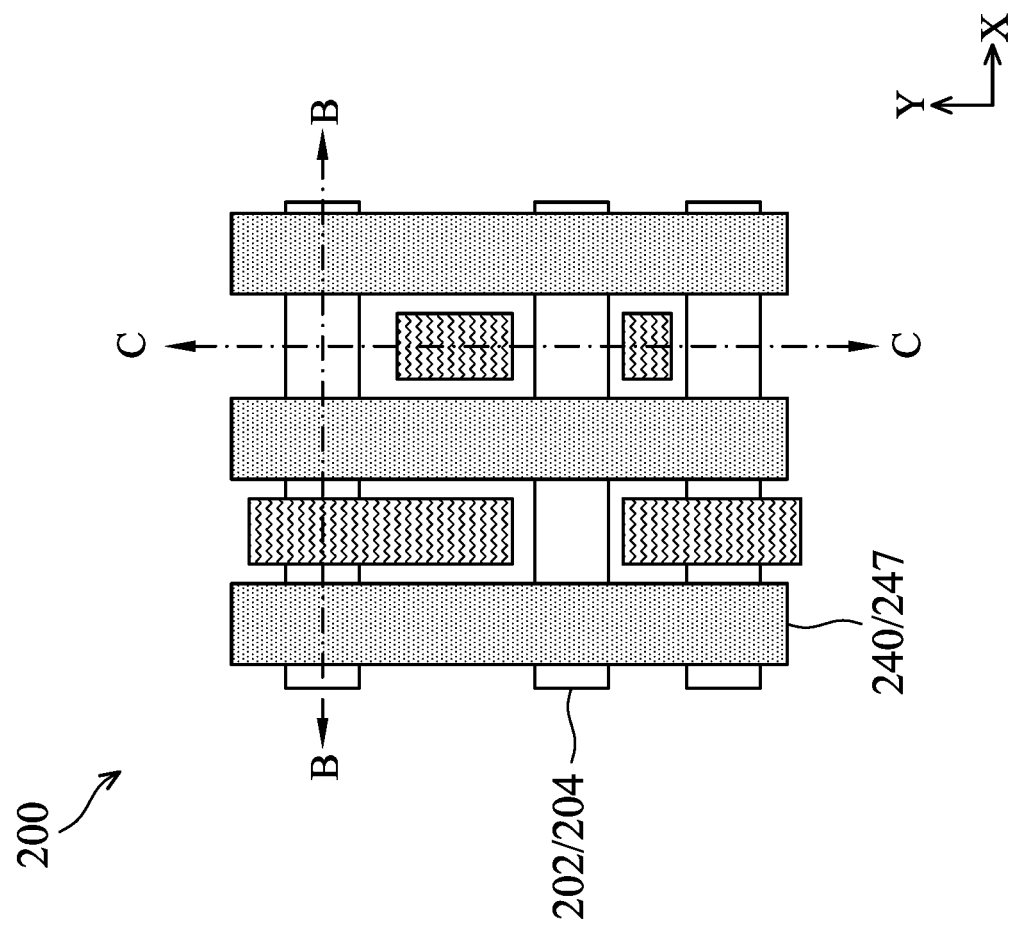
Figure 5B:
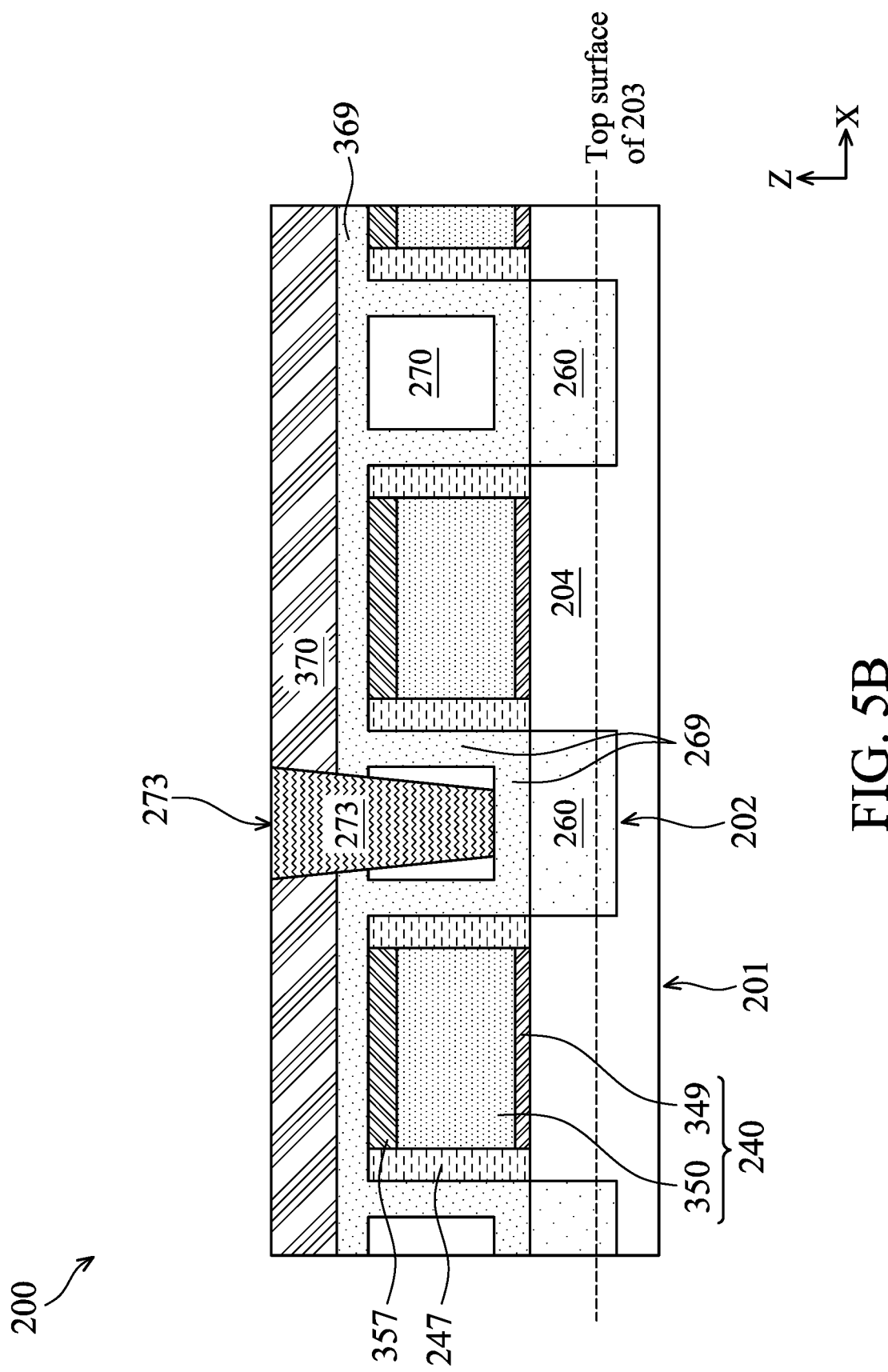
Figure 5C:
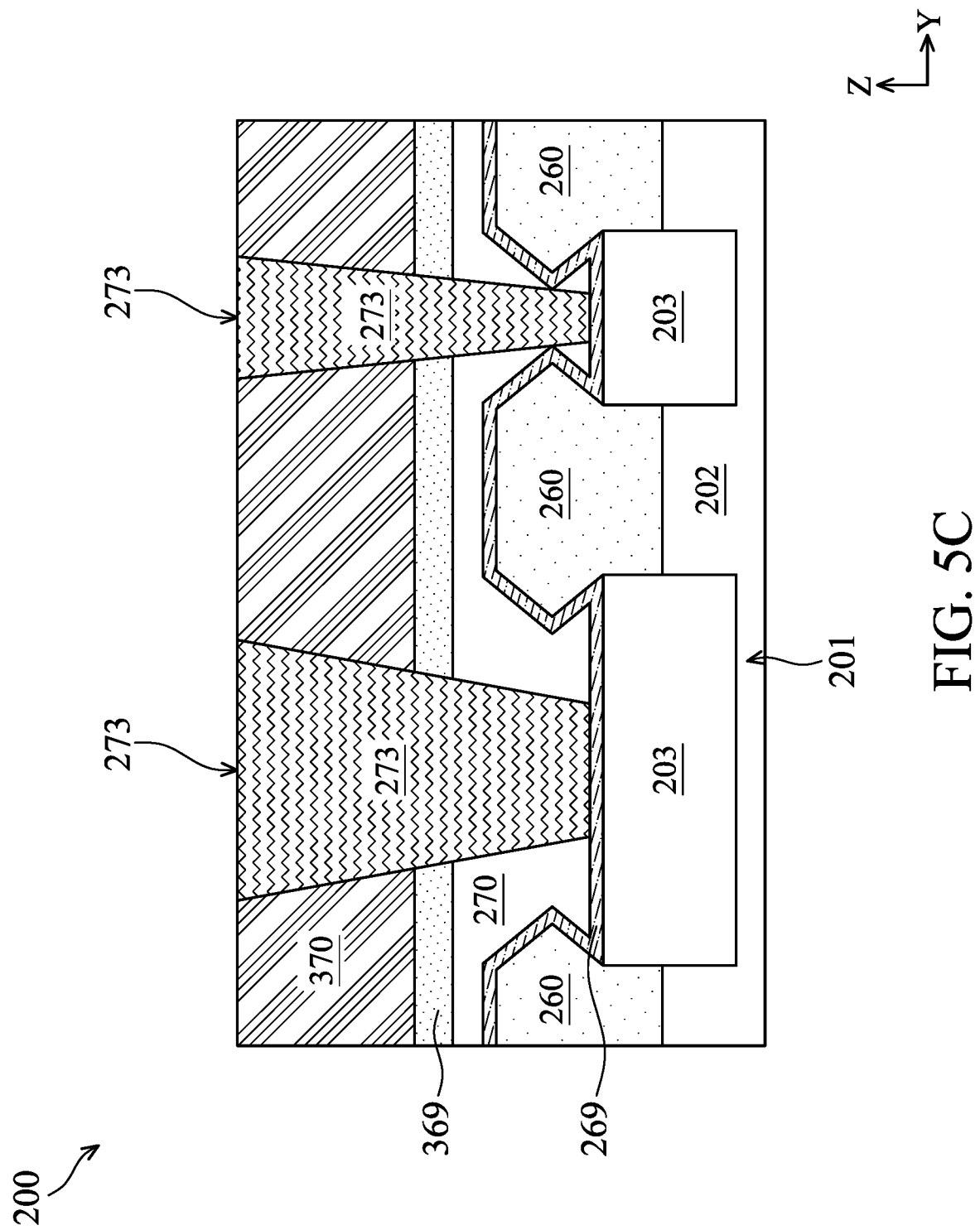

At operation 18, the method 10 (FIG. 1A) deposits one or more plugging dielectric layers (or dielectric plugs) 273 over the semiconductor device 200 and filling the trenches 272, such as shown in FIGS. 5A-5C. In an embodiment, the patterned hard mask 361 is completely removed prior to operation 18. In an alternative embodiment, the patterned hard mask 361 or a portion there of is not removed prior to operation 18. The dielectric plugs 273 or at least the top portions thereof include a material different from the materials included in the ILD layer 370 in order to achieve etch selectivity in a subsequent etching process (discussed in operation 22 below). In an embodiment, the dielectric plugs 273 include $La_2O_3$, $Al_2O_3$, AlON, $ZrO_2$, $HfO_2$, $Si_3N_4$, ZnO, ZrN, ZrAlO, $TiO_2$, $Ta_2O_5$, $Y_2O_3$, TaCN, SiOCN, SiOC, SiCN, or a combination thereof. The dielectric plugs 273 may be deposited using CVD, FCVD, PVD, ALD, HDPCVD, MOCVD, RPCVD, PECVD, LPCVD, ALCVD, APCVD, other suitable methods, or combinations thereof. Subsequently, the method 10 (FIG. 1A) at operation 18 performs a CMP process to the dielectric plugs 273 and the patterned hard mask 361 if present until the ILD layer 370 is exposed, such as shown in FIGS. 5B-5C. The ILD layer 370 serves as a CMP stop in an embodiment. The remaining portions of the dielectric plugs 273 fill the trenches 272.

Figure 6A:
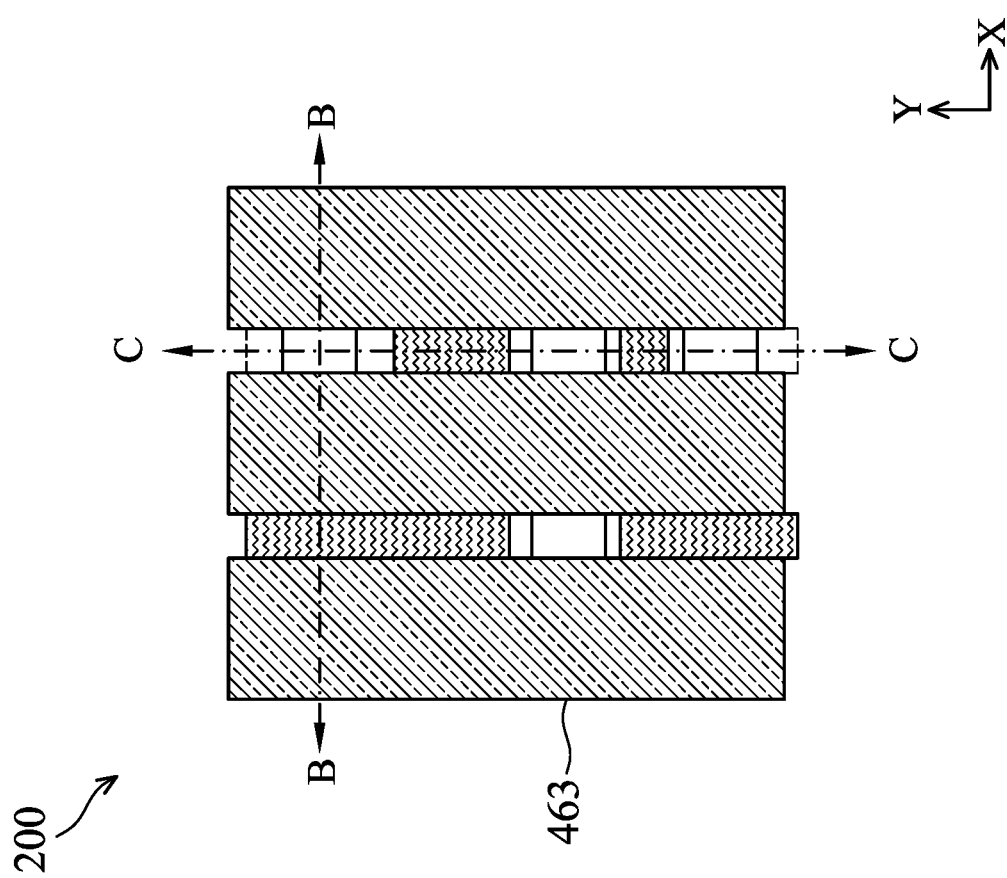
Figure 6B:
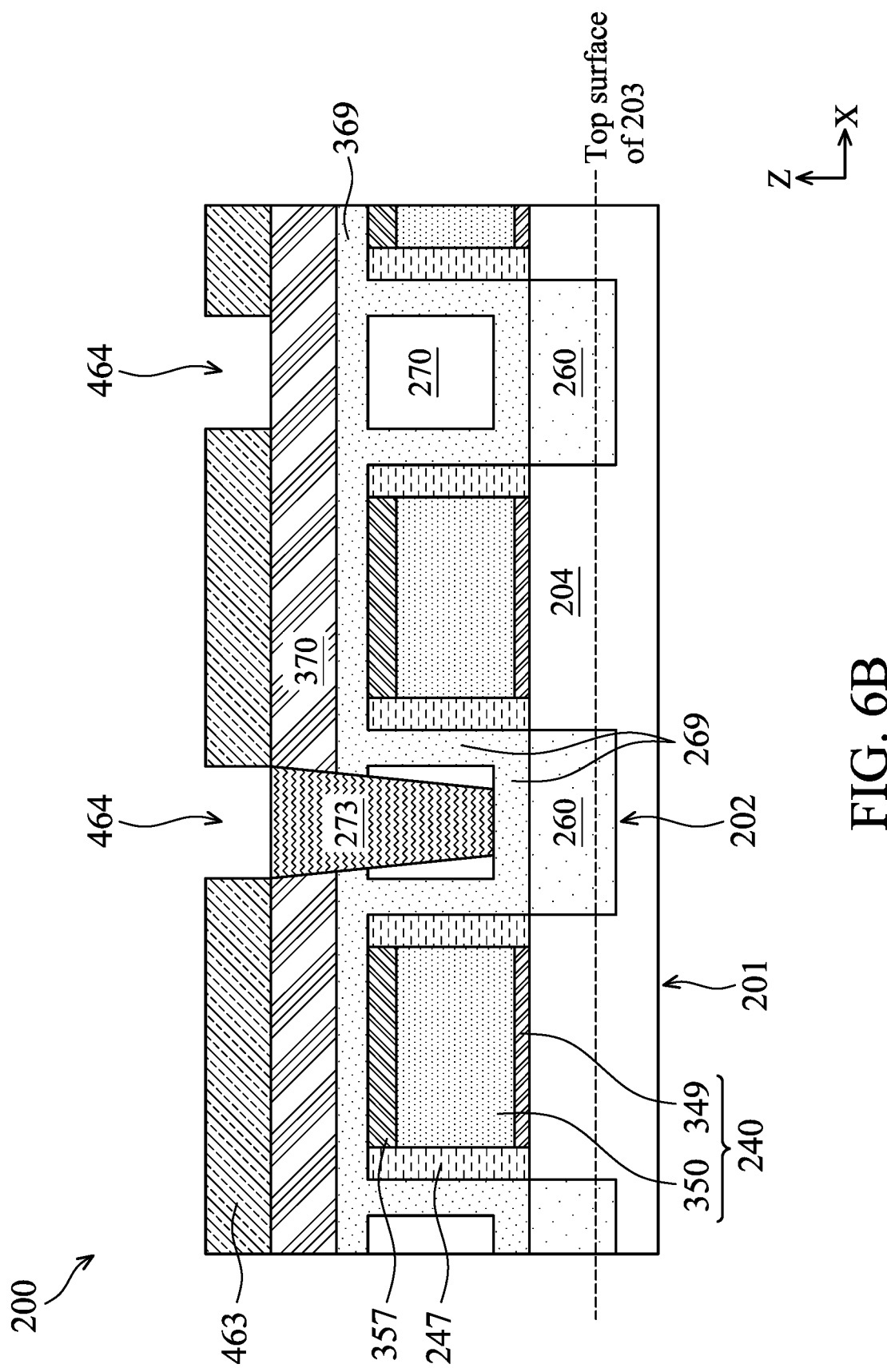
Figure 6C:
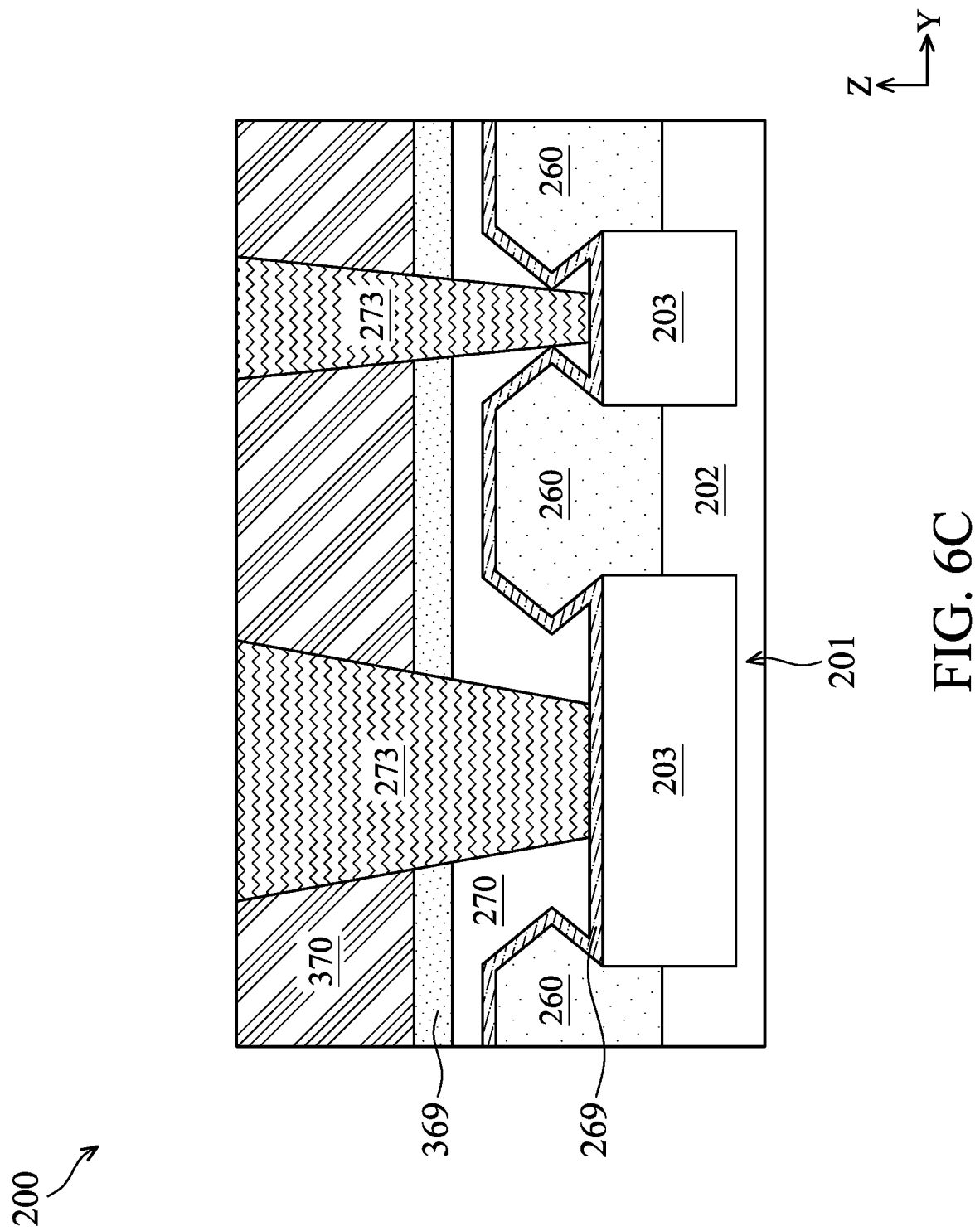

At operation 20, the method 10 (FIG. 1A) forms a second etch mask 463 over the ILD layer 370 and the dielectric plugs 273, such as shown in FIGS. 6A-6C. In an embodiment, the etch mask 463 includes a resist pattern over a hard mask pattern, like the etch mask 360. In another embodiment, the etch mask 463 includes a resist pattern only. The etch mask 463 may be formed using deposition, photolithography, and etching processes, like those discussed for operation 14. The etch mask 463 provides various openings 464 directly above areas where one or more S/D contacts 282 (FIGS. 8A-8C) are to be formed. The etch mask 463 covers the gate structures 240 and the gate spacers 247 from subsequent etching processes. Further, the openings 464 are aligned with the dielectric plugs 273. In other words, the dielectric plugs 273 or a major portion thereof are exposed through the openings 464.

Figure 7A:
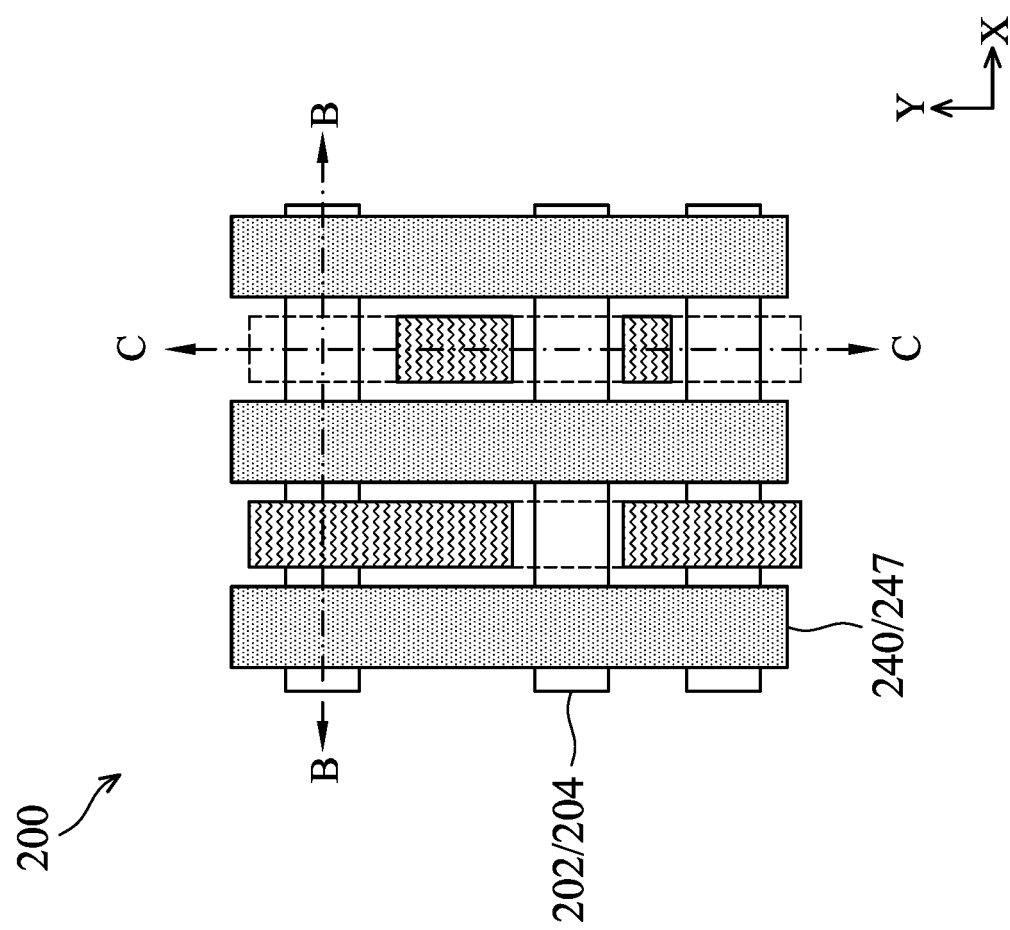
Figure 7B:
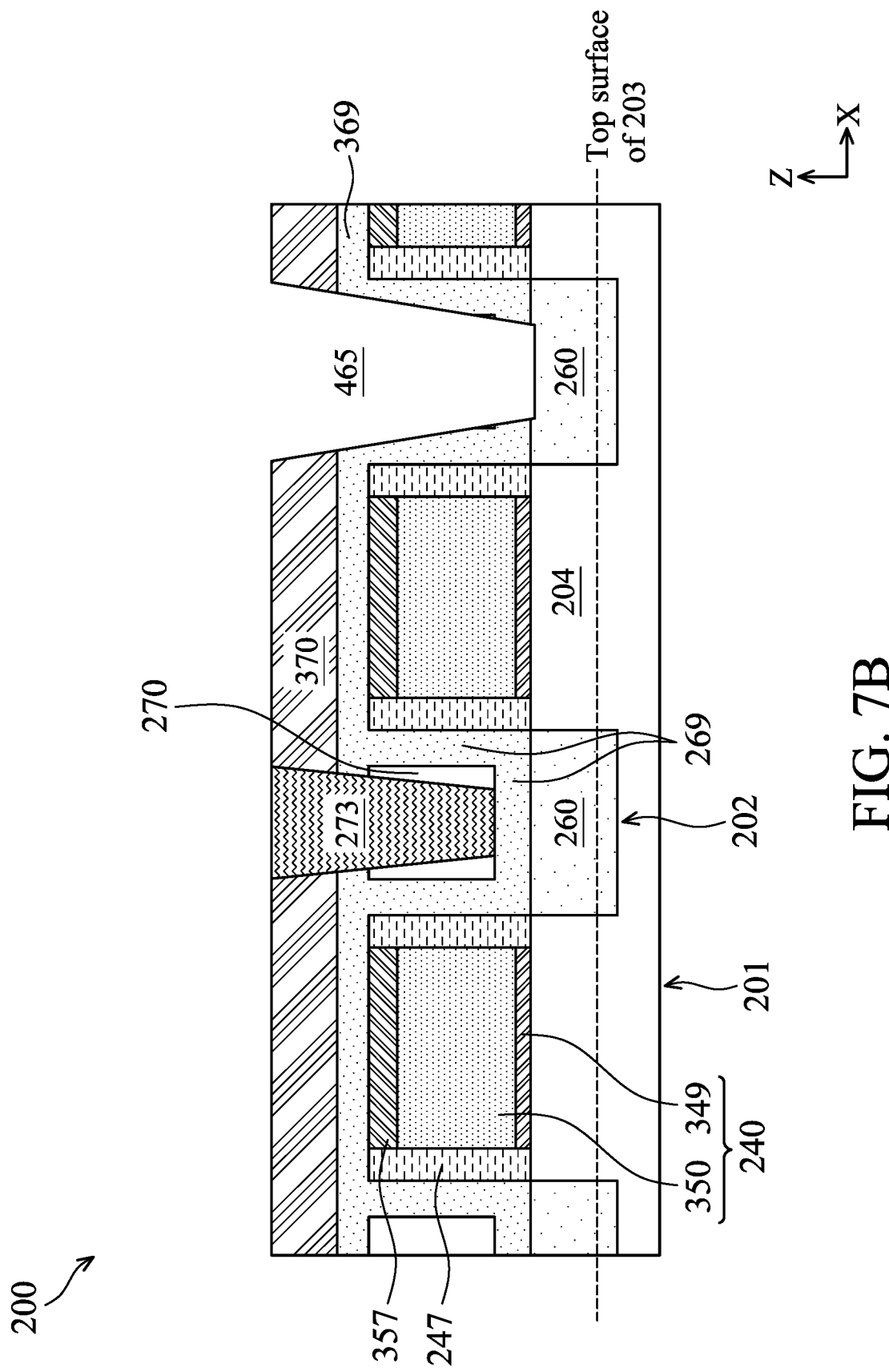
Figure 7C:
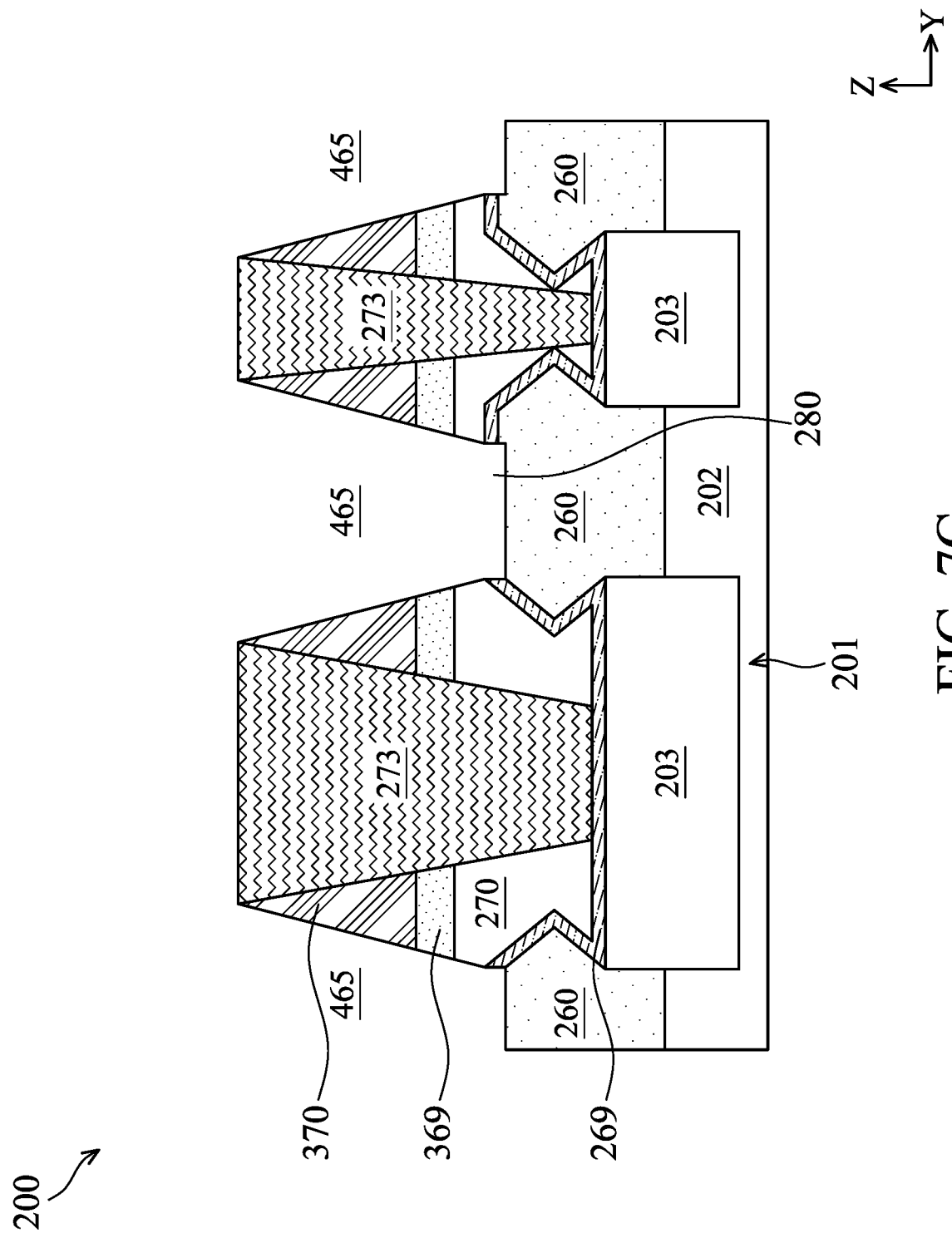

At operation 22, the method 10 (FIG. 1B) etches the ILD layers 370 and 270 and the ESLs 369 and 269 to expose the S/D electrodes 260, resulting in S/D contact holes 465, such as shown in FIGS. 7A-7C. The dielectric plugs 273 and the etch mask 463 collectively serve as an etch mask during the etching process(es), which provides manufacturing process margin and prevents hard mask peeling issues associated with other approaches. Taking the dielectric plug 273 (right) in FIG. 7C as an example, the length of the dielectric plug 273 along the "X" and "Y" directions can be very small, such as equal to or close to the critical dimension (CD) of the manufacturing process. In some approaches, a small hard mask is used in place of the dielectric plug 273. The small hard mask may be peeled off during the etching process, for example, due to insufficient adhesion, excessive lateral etching, etc. When this happens, the two contact holes on the right side of FIG. 7C would become one, leading to short-circuit defects. In contrast, using the dielectric plug 273 does not have such peeling issue since it is formed deeply in the dielectric layers 370, 270, 369, and 269.

Another advantage of using dielectric plugs 273 and the etch mask 463 collectively as an etch mask is to mitigate etching loading effects between long and short contact holes 465 (with length defined along the "Y" direction in FIG. 7A). Generally, some polymer (such as polymers containing F, N, O, and/or other materials) may be generated on the sidewalls of the contact hole during etching. Such polymer may slow down the lateral etching along the "X" direction. Generally, the longer the contact hole, the lower the aspect ratio (defined as the height of the contact hole over the length of the contact hole). Generally, the lower aspect ratio of a contact hole, the more polymer is generated on the sidewalls of the contact hole during etching, and the less lateral etching along the "X" direction. Therefore, when two contact holes have a greater difference in their aspect ratios, their dimensions along the "X" direction may have a greater difference as well. When a hard mask is used instead of the dielectric plugs 273, the holes (during etching) would have a higher aspect ratio than the present embodiment in the cross-sectional view along the "C-C" line since the hard mask would be formed above the ILD layer 370. In contrast, there is no hard mask in the cross-sectional view along the "C-C" line as shown in FIG. 6C. Therefore, using the present embodiment, the aspect ratios of different contact holes have a smaller difference, which results in a smaller difference in the widths of the contact holes along the "X" direction.

At operation 24, the method 10 (FIG. 1B) removes the etch mask 463, for example, using resist stripping, etching, and/or other suitable methods.

Figure 8A:
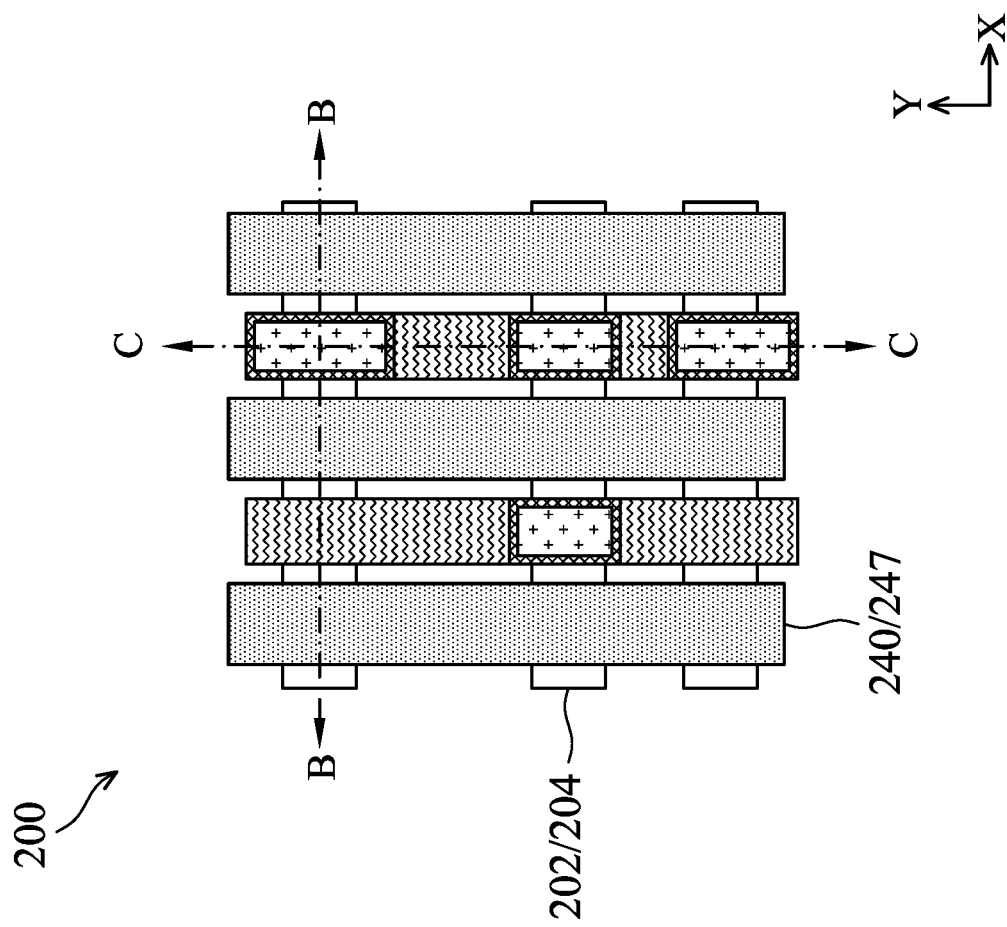
Figure 8B:
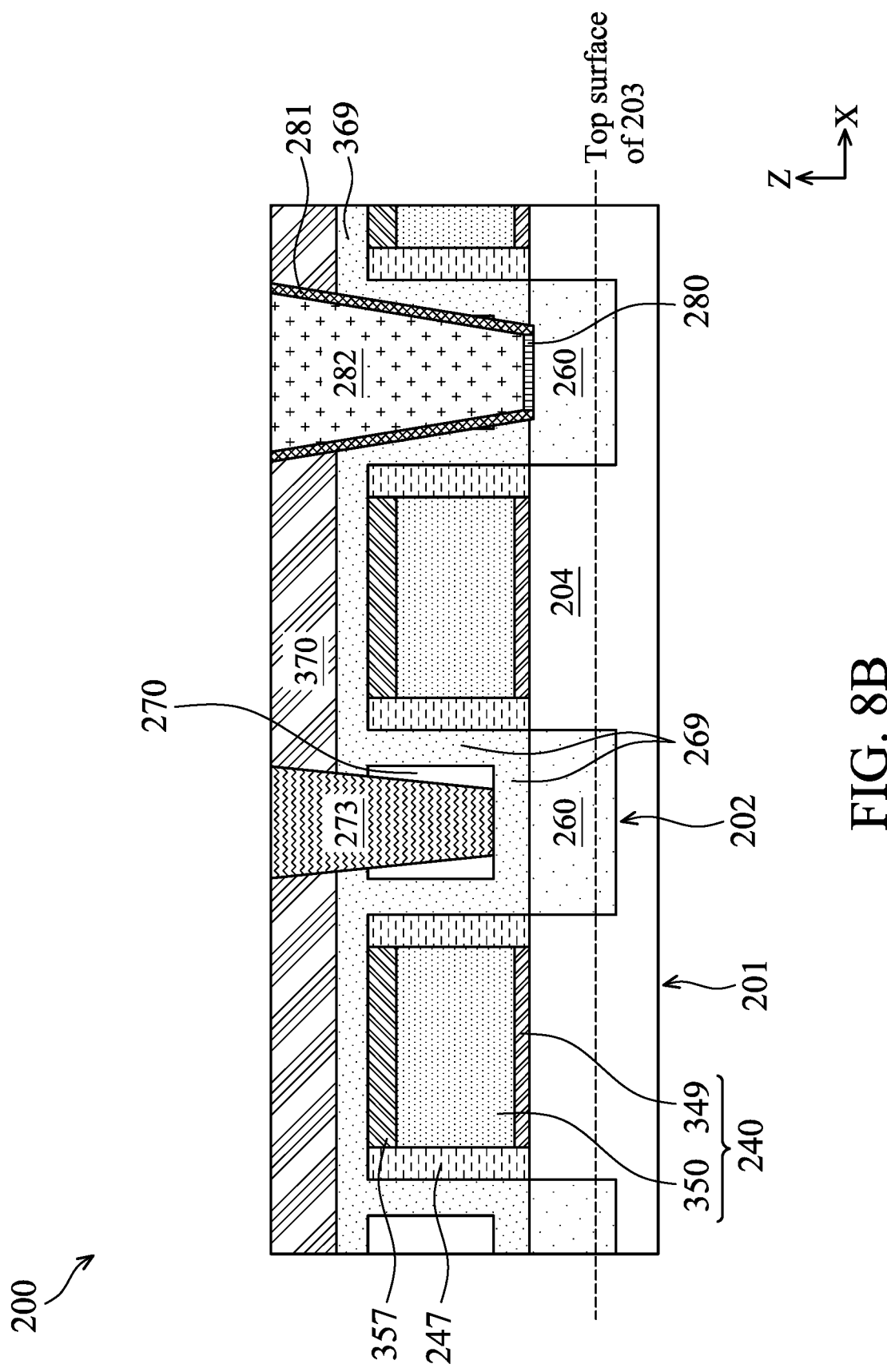
Figure 8C:
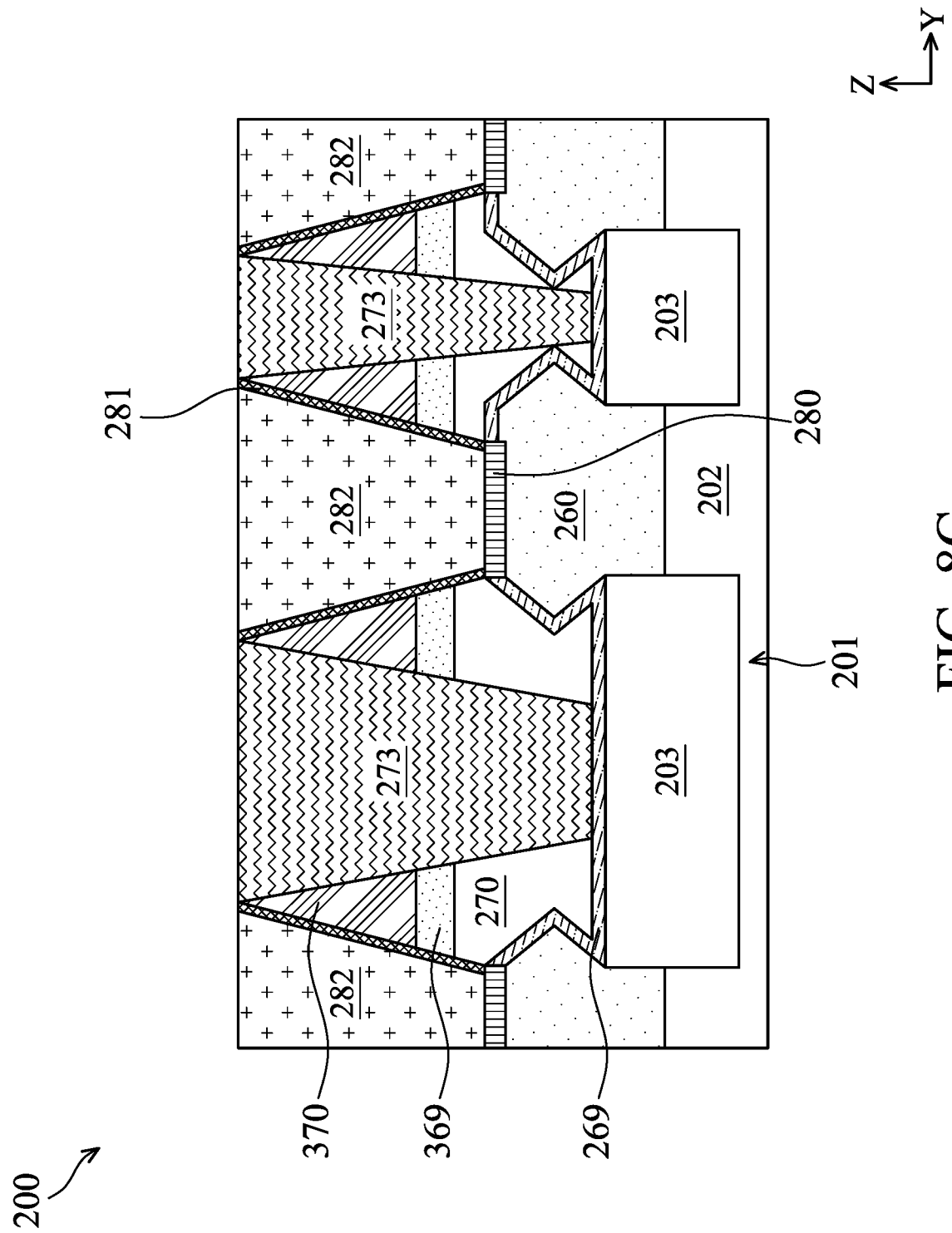

At operation 26, the method 10 (FIG. 1B) forms various structures in the contact holes 465. For example, the method 10 may form a liner 281 on sidewalls of the contact holes 465, form a silicide layer 280 at the bottom of the contact holes 465, and form S/D contacts 282 (or S/D contact plugs 282) on the silicide layer 280 and the liner 281, such as shown in FIGS. 8A-8C. The liner 281 may include $La_2O_3$, $Al_2O_3$, AlON, $ZrO_2$, $HfO_2$, $Si_3N_4$, ZnO, ZrN, ZrAlO, $TiO_2$, $Ta_2O_5$, $Y_2O_3$, TaCN, SiOCN, SiOC, SiCN, or a combination thereof, and may be deposited using CVD, PVD, ALD, other suitable methods, or combinations thereof. The liner 281 may be deposited along surfaces of the contact holes 465 including at the bottom of the contact holes 465, and then etched back. The liner 281 may be about 1 nm to about 5 nm thick. In some embodiments, the liner 281 is omitted.

To form the silicide layer 280, the method 10 may deposit one or more metals into the contact holes 465, perform an annealing process to the semiconductor device 200 to cause reaction between the one or more metals and the S/D electrodes 260 to produce the silicide layer 280, and remove un-reacted portions of the one or more metals, leaving the silicide layer 280 in the contact holes 465. The silicide layer 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In some embodiments, the silicide layer 280 is omitted.

In embodiments, the S/D contacts 282 may include tungsten (W), cobalt (Co), molybdenum (Mo), ruthenium (Ru), copper (Cu), nickel (Ni), titanium (Ti), tantalum (Ta), aluminum (Al), titanium nitride (TiN), tantalum nitride (TaN), or other metals, and may be formed by CVD, PVD, ALD, plating, or other suitable processes. In some embodiments, the S/D contacts 282 include a barrier layer as an outer layer and the barrier layer may include TiN, TaN, TiSiN, or other suitable material.

In an embodiment, the method 10 at operation 26 performs a CMP process to remove excessive materials of the S/D contacts 282 above the top surface of the semiconductor device 200. This exposes the top surface of the ILD layer 370 and the dielectric plugs 273, such as shown in FIGS. 8A-8C. Referring to FIGS. 8A-8C, the dielectric plugs 273 isolate adjacent S/D contacts 282 from each other. Since the dielectric plugs 273 are formed before the S/D contacts 282 and function as a cut feature (or an isolator) for the S/D contacts 282, they are also referred to as pre-cut or reverse-cut dielectric plugs, and the S/D contacts 282 are pre-cut or reversely cut by the dielectric plugs 273.

Figure 9A:
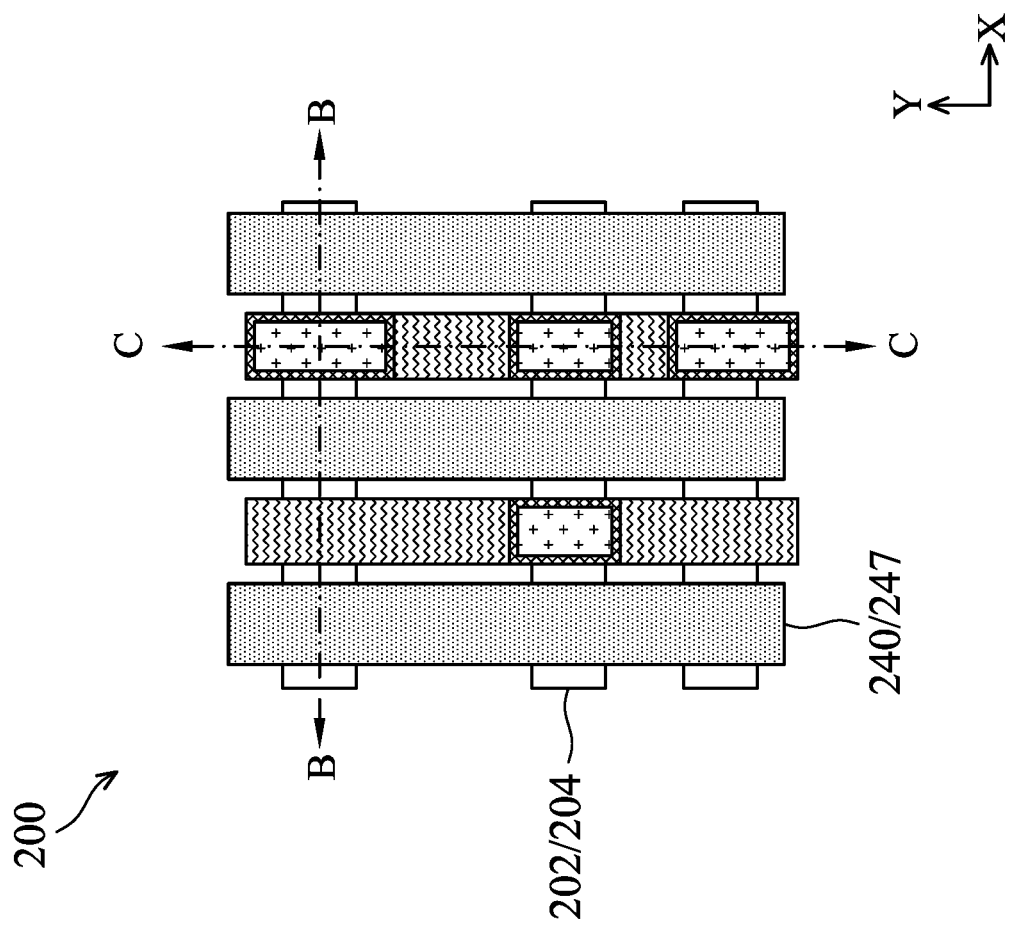
Figure 9B:
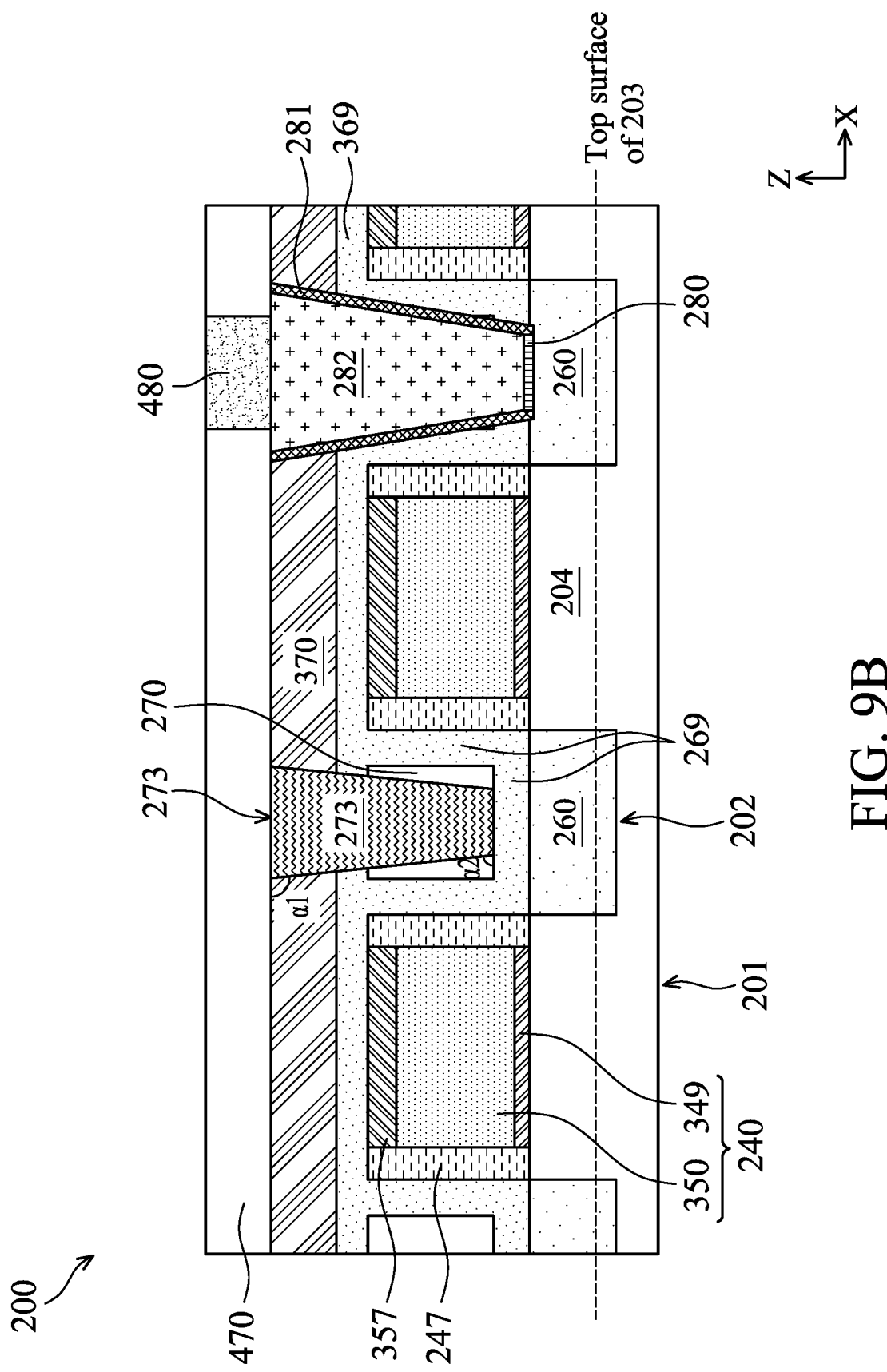
Figure 9C:
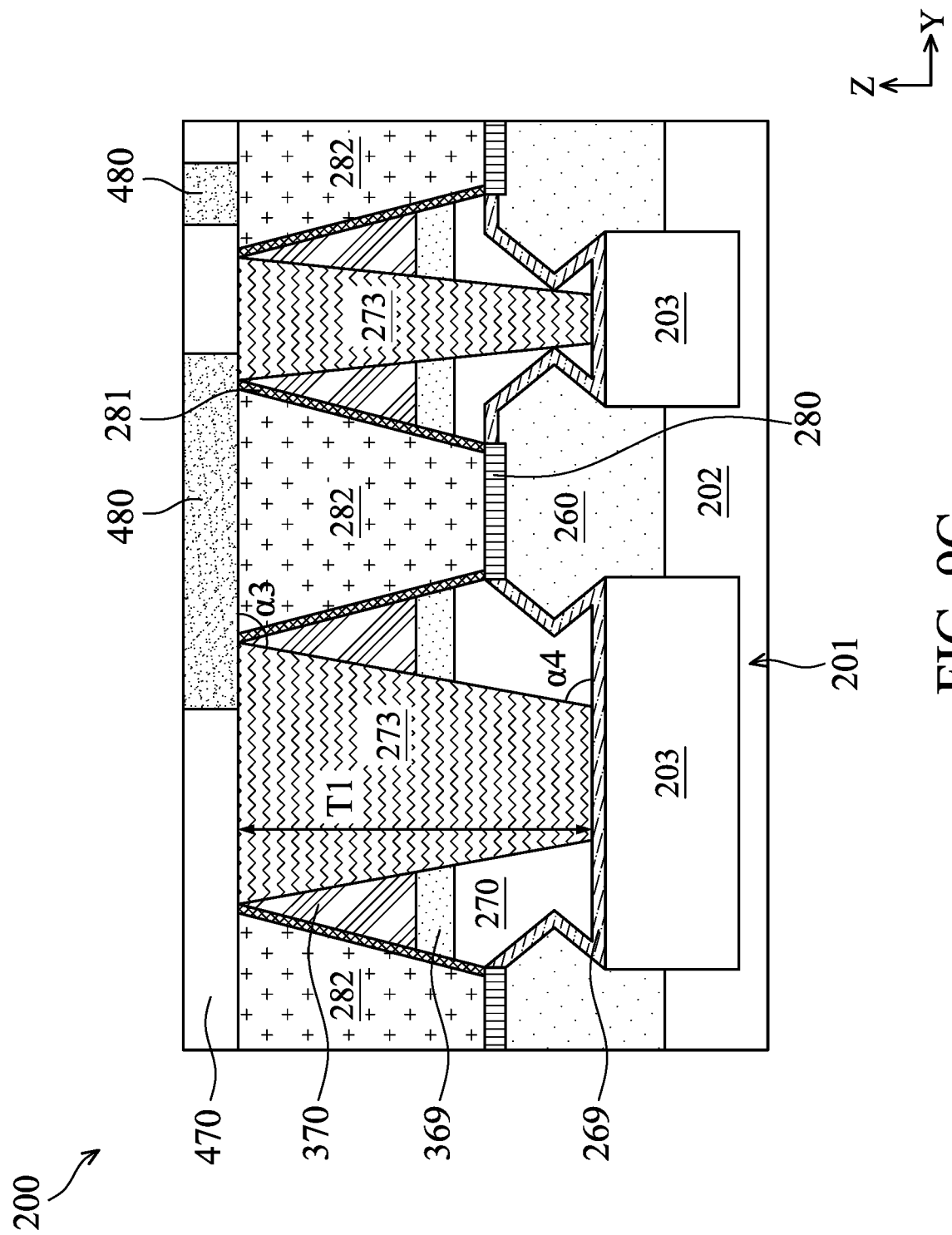

At operation 28, the method 10 (FIG. 1B) forms S/D contact vias 480 on the S/D contacts 282, such as shown in FIGS. 9A-9C. This involves a variety of processes, including deposition and etching. For example, the method 10 may form one or more dielectric layers 470 over the LD layer 370 and the dielectric plugs 273, perform an etch process to form via holes above the S/D contacts 282, and deposit the S/D contact vias 480 in the via holes. The dielectric layers 470 may include dielectric materials similar to the ILD layer 370 and/or the ESL 369. The S/D contact vias 480 may include one or more conductive materials such as Co, W, Ru, Al, Mo, Ti, TiN, TiSi, CoSi, NiSi, TaN, Ni, TiSiN, or combinations thereof, and may be formed by CVD, PVD, plating, and/or other suitable processes. The S/D contact vias 480 penetrate through the dielectric layers 470 atop the S/D contacts 282 and make electrical contact with the S/D contacts 282. In some embodiments, the S/D contact vias 480 may partially land on the dielectric plugs 273 and may be in direct contact with the dielectric plugs 273.

Referring to FIGS. 9A-9C, in an embodiment, the dielectric plugs 273 have a thickness T1 (along the "Z" direction) that ranges from about 40 nm to about 100 nm. Further, the dielectric plugs 273 have slanted sidewalls, which are the same as the slanted sidewalls of the trenches 272 (see FIGS. 4A-4C). In the cross-sectional view along the "B—B" line (FIG. 9B), the dielectric plug 273 forms an angle α1 with the top surface of the ILD layer 370 and an angle α2 with the top surface of the ESL 269 (or the bottom surface of the ILD layer 370). In an embodiment, the angle α1 may be in the range of about 90.5 degrees to about 100 degrees, and the angle α2 may be in the range of about degrees to about 89.5 degrees. In the cross-sectional view along the "C-C" line (FIG. 9C), the dielectric plug 273 forms an angle α3 with the top surface of the ILD layer 370 (or the top surface of the S/D contacts 282) and an angle α4 with the top surface of the ESL 269 (or the bottom surface of the ILD layer 370). In an embodiment, the angle α3 may be in the range of about 90.5 degrees to about 100 degrees, and the angle α4 may be in the range of about 80 degrees to about 89.5 degrees. The slanted sidewalls and the above angles improve the dielectric filling of the trenches 272 so that the dielectric plugs 273 are formed without voids.

At operation 30, the method 10 (FIG. 1B) performs further fabrication to the semiconductor device 200. For example, the method 10 may form gate vias landing on the gate structures 240 and/or the gate caps 357. The method 10 may also form multi-level interconnect structures over the dielectric layers 470 and the S/D contact vias 480.

Figure 10A:
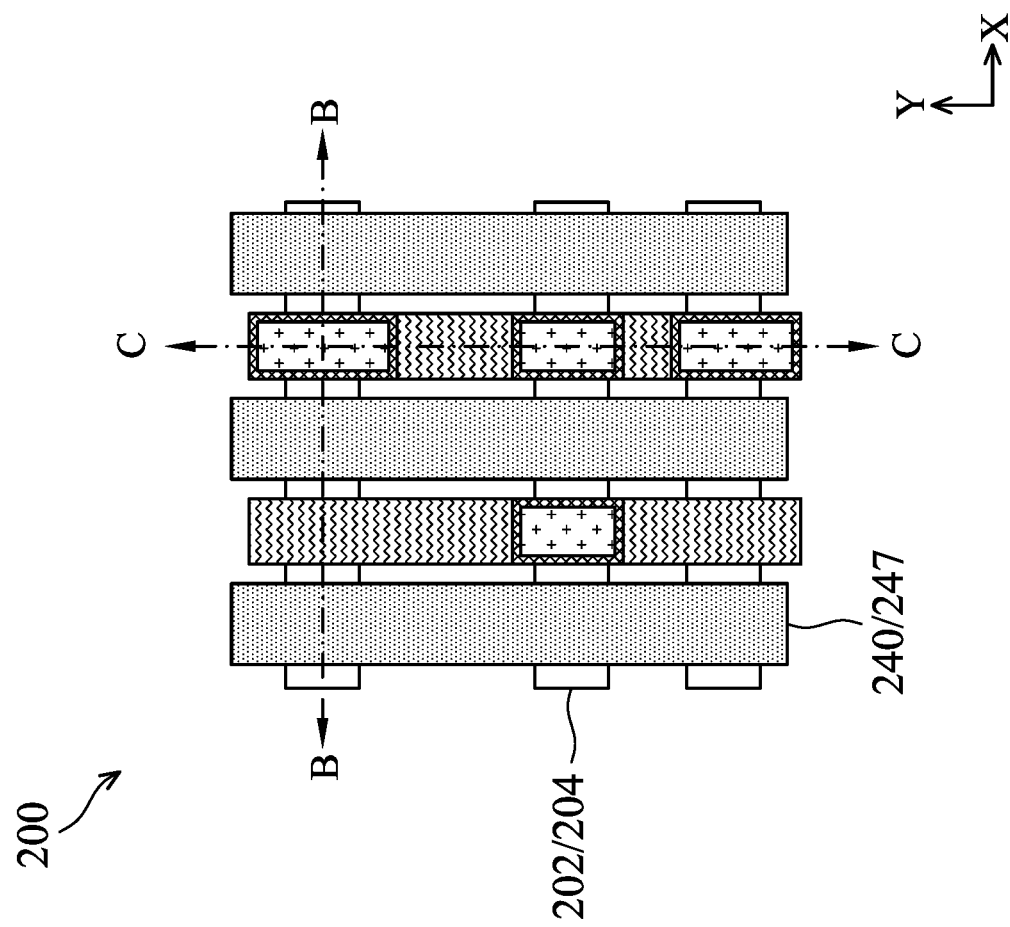
Figure 10B:
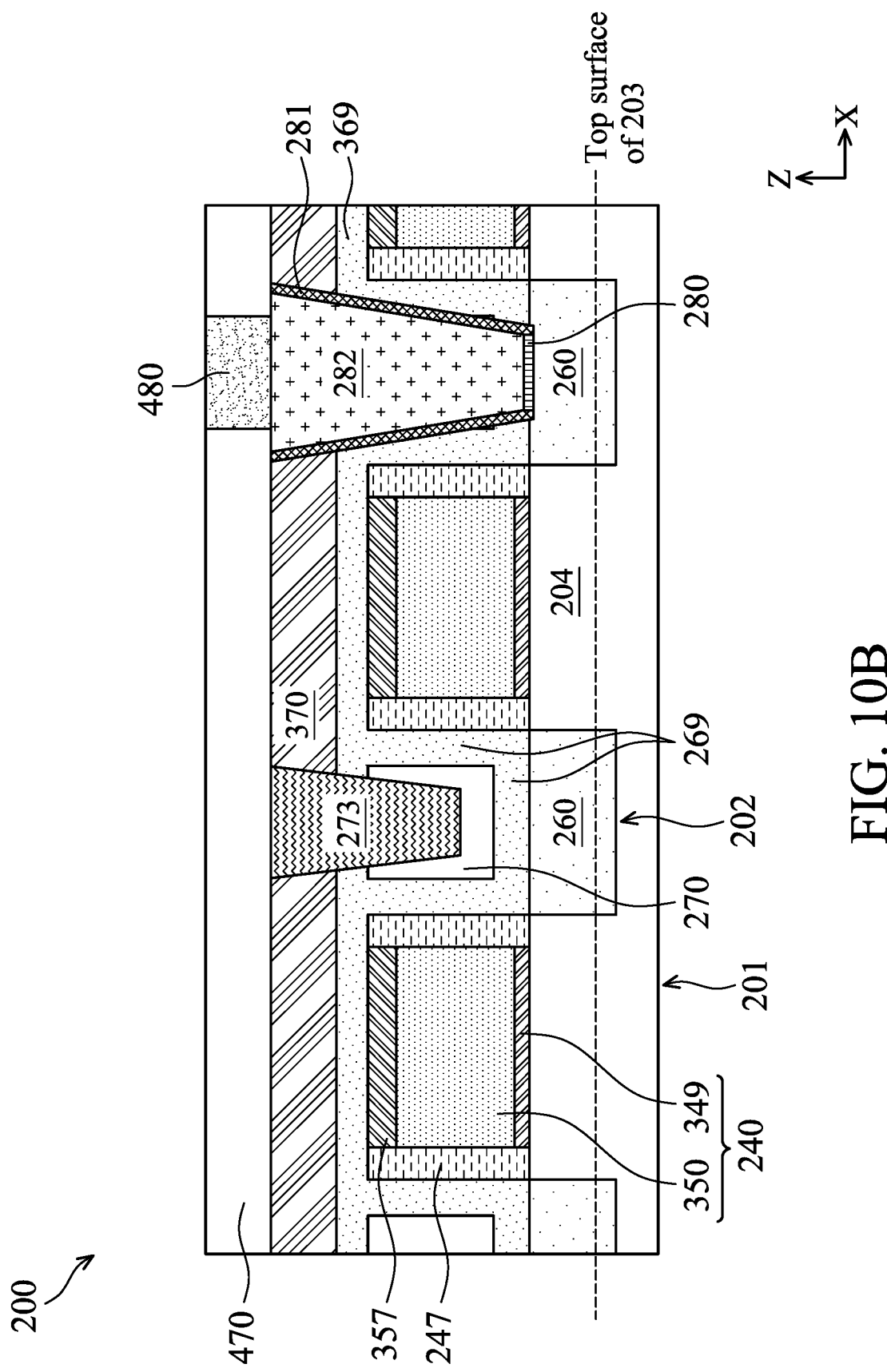
Figure 10C:
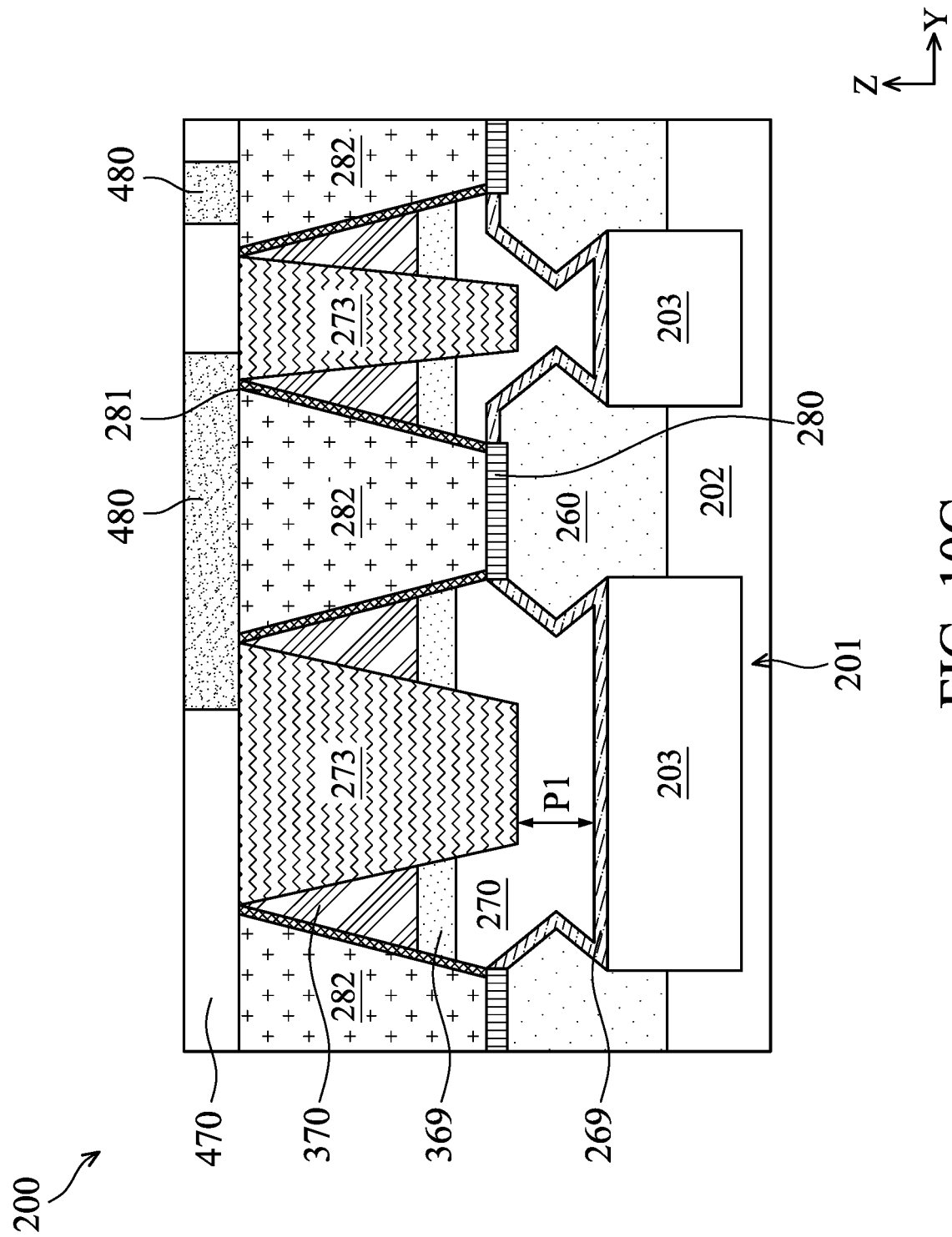

FIGS. 10A-10C illustrate another embodiment of the semiconductor device 200. In this embodiment, the trenches 272 (see FIG. 4A-4C) do not reach the ESL 269 and stop inside the ILD layer 270. As a result, the dielectric plugs 273 do not reach the ESL 269, and the bottom surface of the dielectric plugs 273 is above the bottom surface of the ILD layer 270 by a distance P1. In an embodiment, the distance P1 is in a range of about 1 nm to about 30 nm. Further, in the embodiment depicted in FIGS. 10B-10C, the bottom surface of the dielectric plugs 273 is below the top surface of the ILD layer 270. In alternative embodiments, the bottom surface of the dielectric plugs 273 may be above the top surface of the ILD layer 270 or above the topmost surface of the ESL 269. Because the trenches 272 are shallower in this embodiment than in the embodiment shown in FIGS. 9A-9C, this embodiment makes the dielectric filling of the trenches 272 easier. Other aspects of this embodiment are the same as those of the embodiment shown in FIGS. 9A-9C.

Figure 11A:
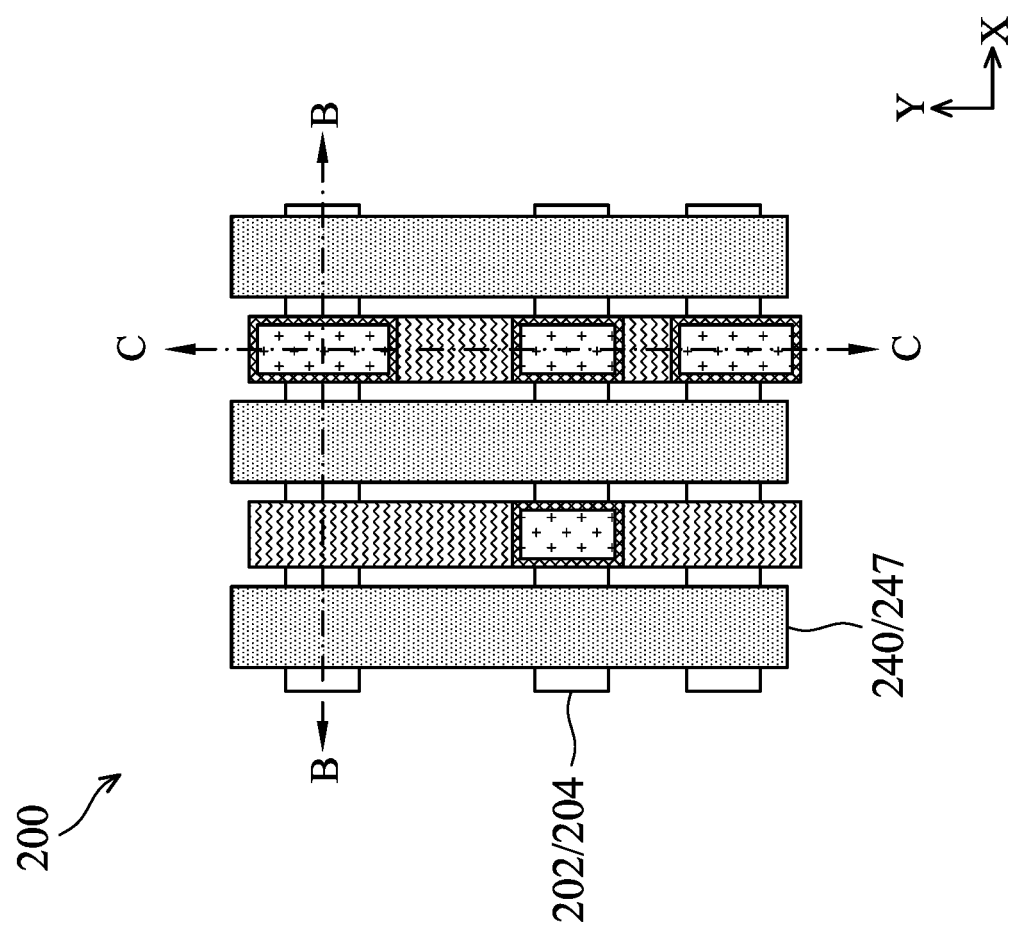
Figure 11B:
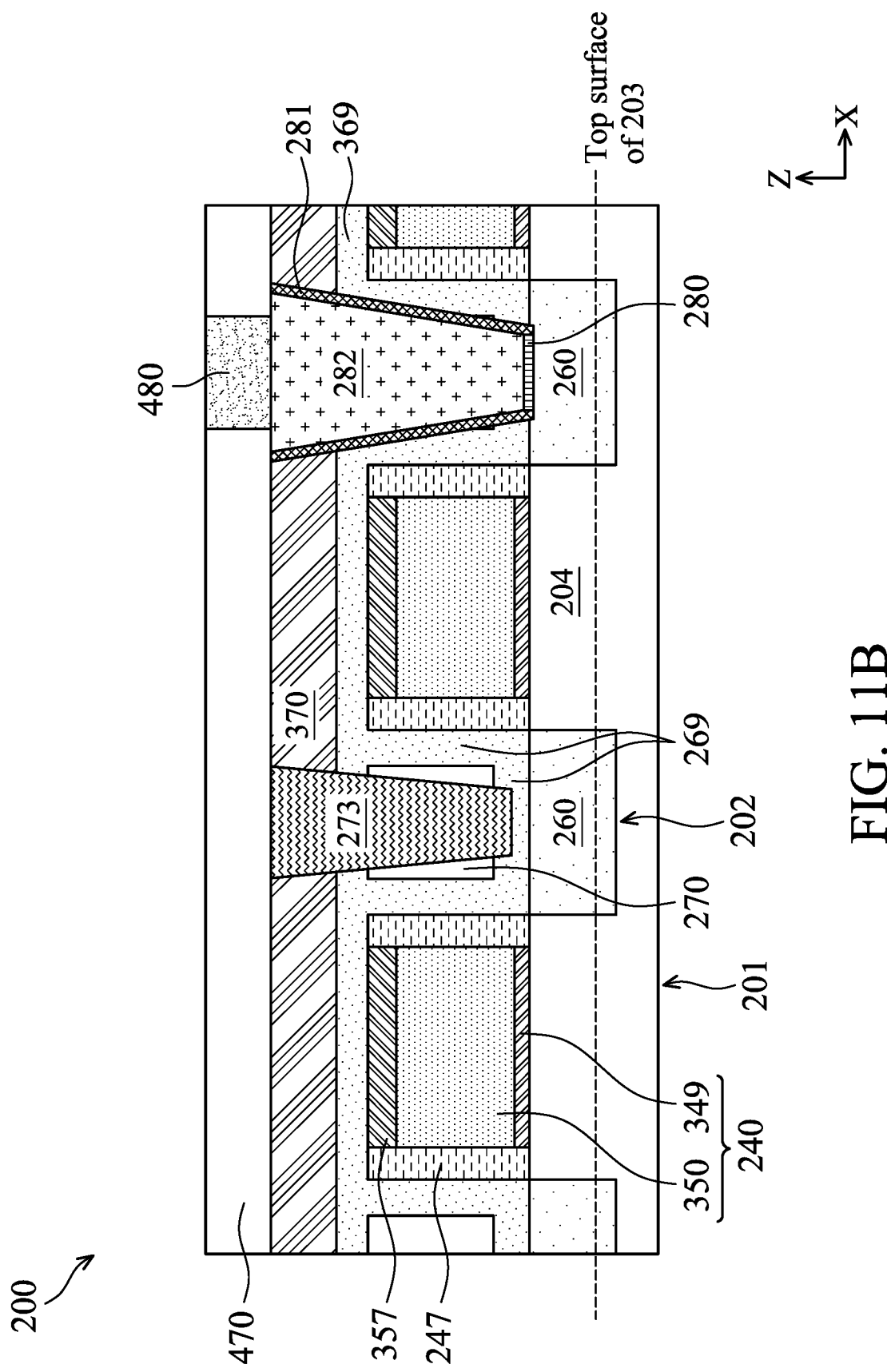
Figure 11C:
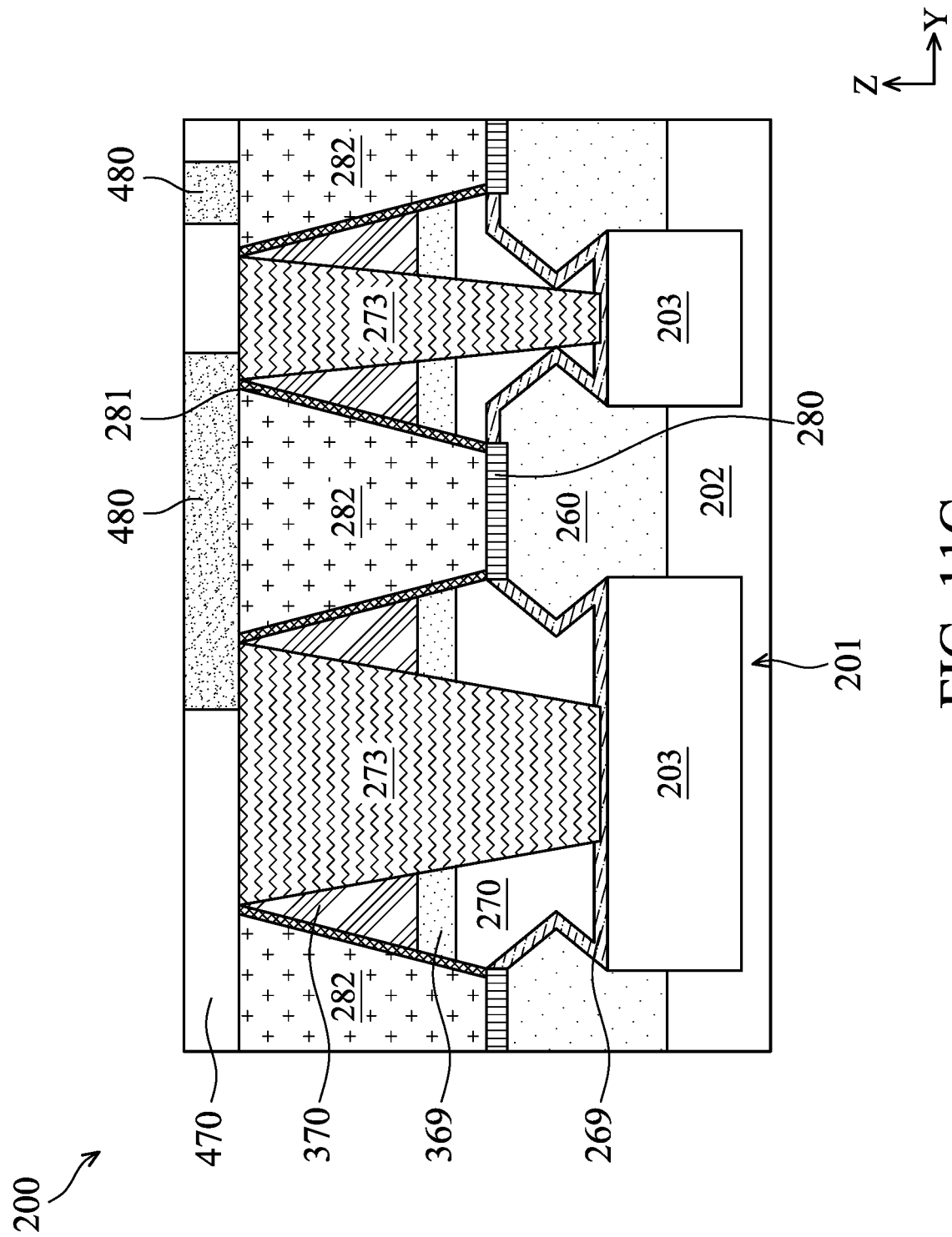

FIGS. 11A-11C illustrate another embodiment of the semiconductor device 200. In this embodiment, the trenches 272 (see FIG. 4A-4C) are partially etched into the ESL 269. As a result, the dielectric plugs 273 are also partially in the ESL 269, and the bottom surface of the dielectric plugs 273 is below the bottom surface of the ILD layer 270 and above the bottommost surface of the ESL 269. Also, the bottom surface of the dielectric plugs 273 is higher than the bottom surface of the source/drain contact 282. Other aspects of this embodiment are the same as those of the embodiment shown in FIGS. 9A-9C.

Figure 12A:
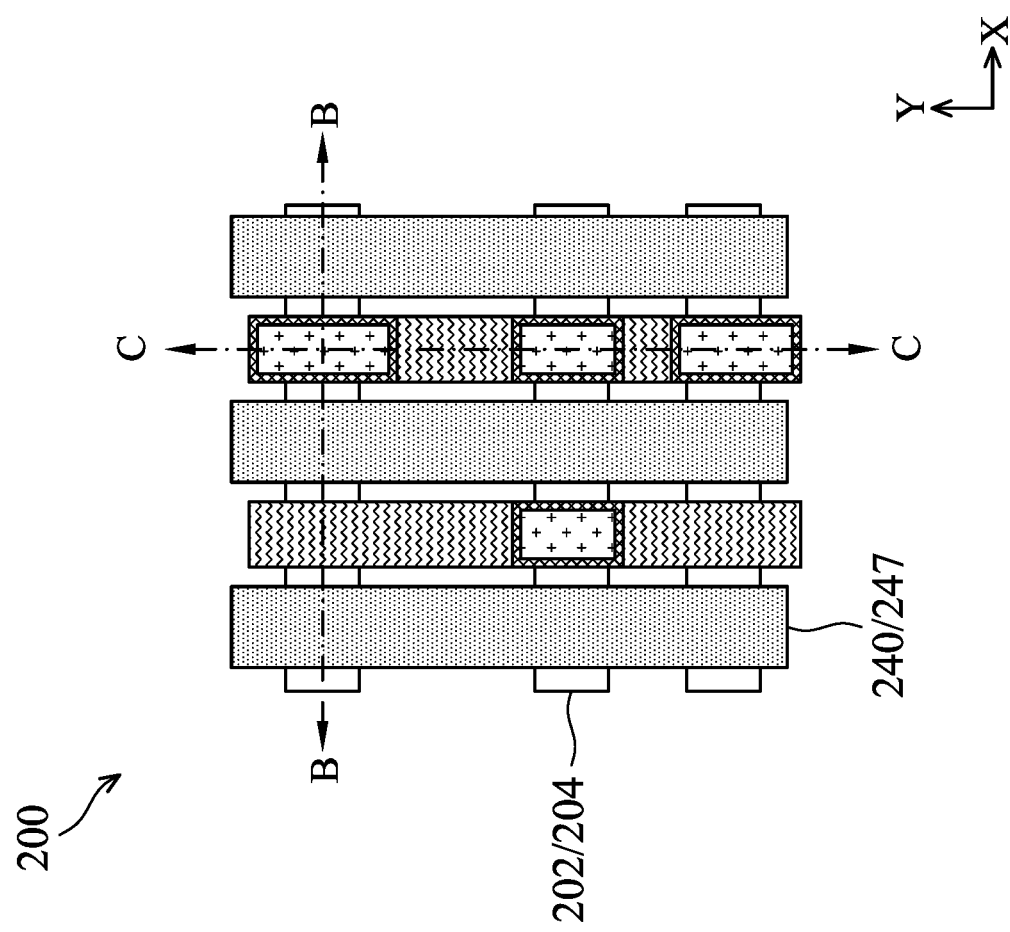
Figure 12B:
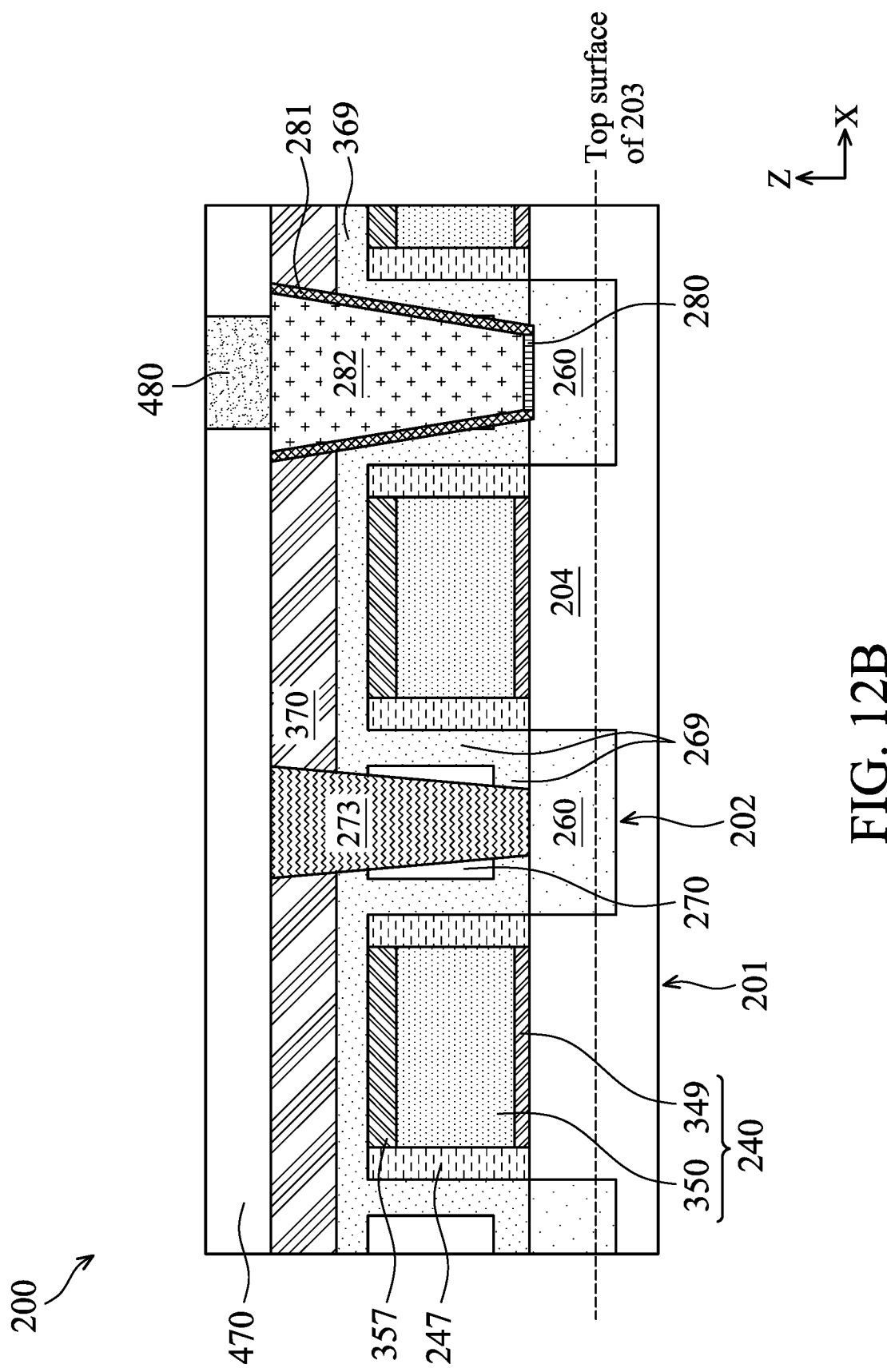
Figure 12C:
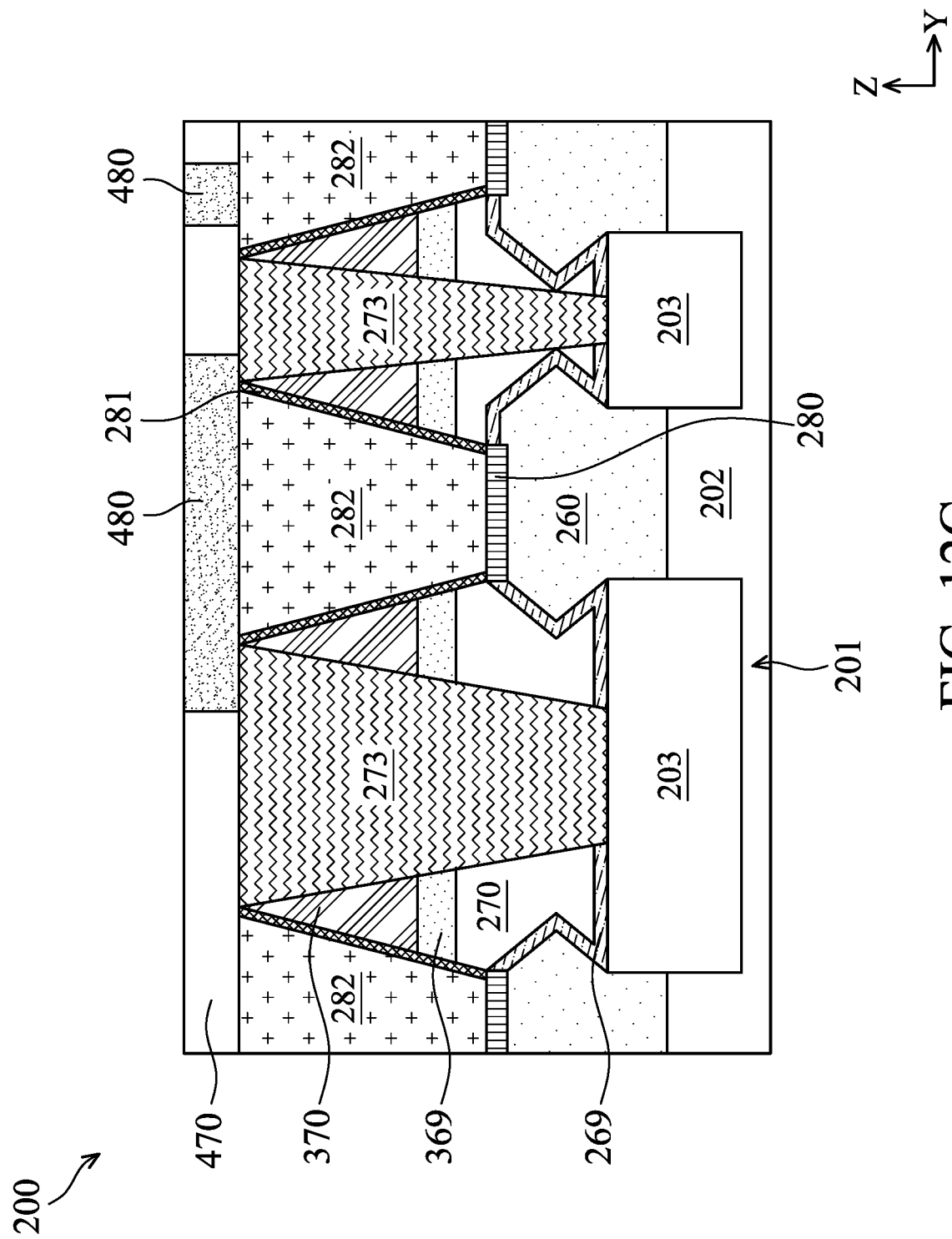

FIGS. 12A-12C illustrate another embodiment of the semiconductor device 200. In this embodiment, the trenches 272 (see FIG. 4A-4C) completely go through the ESL 269. As a result, the dielectric plugs 273 completely penetrate the ESL 269, and the bottom surface of the dielectric plugs 273 directly contacts the S/D electrodes 260 and/or the isolation structure 203. Other aspects of this embodiment are the same as those of the embodiment shown in FIGS. 9A-9C.

Figure 13A:
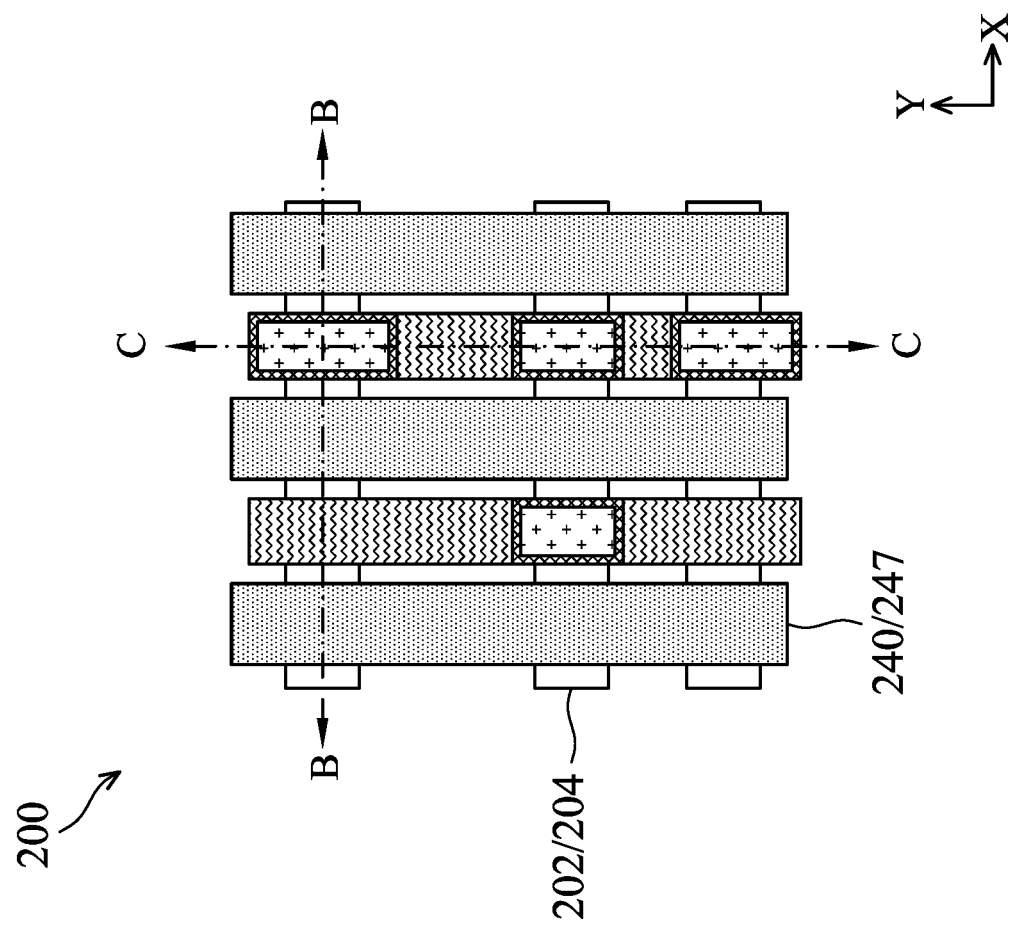
Figure 13B:
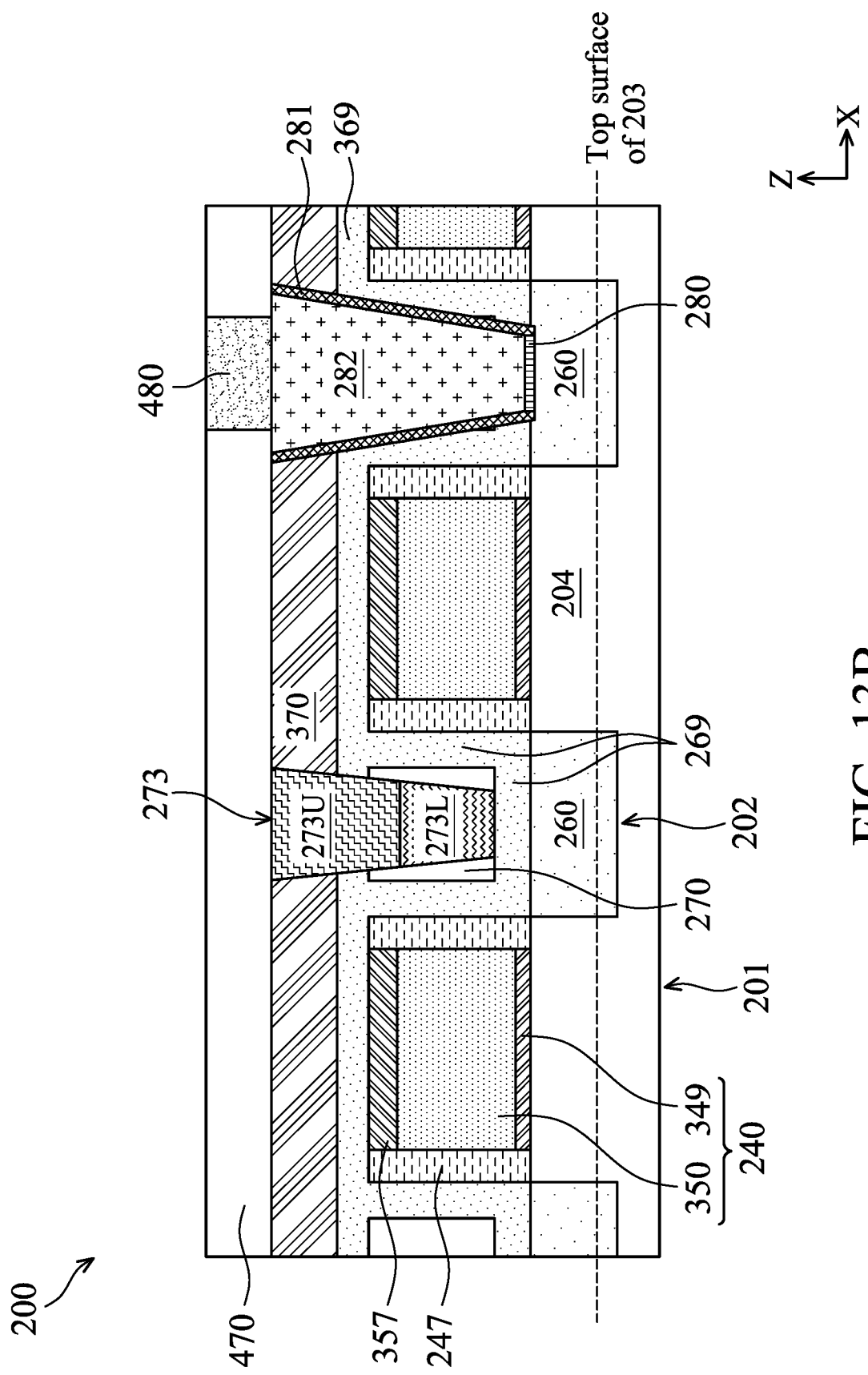
Figure 13C:
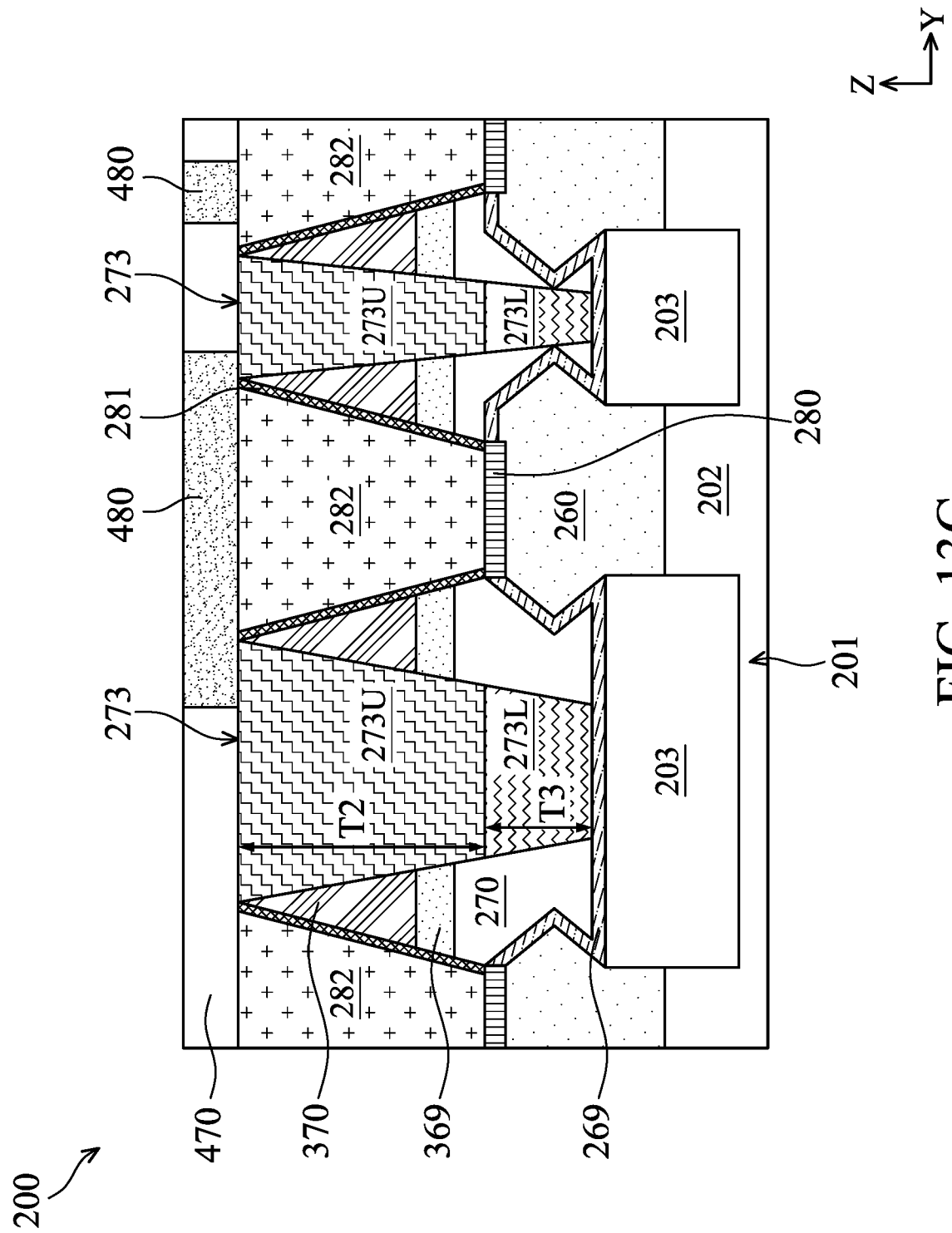

FIGS. 13A-13C illustrate another embodiment of the semiconductor device 200. In this embodiment, each dielectric plug 273 includes two portions, a lower portion 273L and an upper portion 273U. The lower portion 273L is deposited into the trenches 272 first, then the upper portion 273U is deposited on top of the lower portion 273L. In an embodiment, the two portions 273L and 273U include different dielectric materials. For example, the lower portion 273L may include a material that is more suitable for filling narrow holes than the material in the upper portion 273U, while the upper portion 273U may include a material that provides more etch selectivity with respect to the ILD layer 370 than the lower portion 273L. In various embodiments, the upper portion 273U may include $La_2O_3$, $Al_2O_3$, AlON, $ZrO_2$, $HfO_2$, $Si_3N_4$, ZnO, ZrN, ZrAlO, $TiO_2$, $Ta_2O_5$, $Y_2O_3$, TaCN, SiOCN, SiOC, SiCN, or a combination thereof, and the lower portion 273L may include $La_2O_3$, $Al_2O_3$, AlON, $ZrO_2$, $HfO_2$, $Si_3N_4$, ZnO, ZrN, ZrAlO, $TiO_2$, $Ta_2O_5$, $Y_2O_3$, TaCN, SiOCN, SiOC, SiCN, or a combination thereof, which is different from the material in the upper portion 273U. Further, in the embodiment depicted in FIGS. 13B-13C, the top surface of the lower portion 273L is below the top surface of the ILD layer 270. In alternative embodiments, the top surface of the lower portion 273L may be above the top surface of the ILD layer 270 or above the topmost surface of the ESL 269. The upper portion 273U has a thickness T2 which may range from about 10 nm to about 30 nm in various embodiments. The lower portion 273L has a thickness T3 which may range from about 10 nm to about 30 nm in various embodiments. Other aspects of this embodiment are the same as those of the embodiment shown in FIGS. 9A-9C (such as the slanted sidewalls and the angles), 10A-10C (for example, the bottom surface of the lower portion 273L may be above the ESL 269), 11A-11C (for example, the lower portion 273L may partially extend into the ESL 269), and 12A-12C (for example, the lower portion 273L may completely penetrate through the ESL 269 and land on the S/D electrodes 260 and/or the isolation structure 203).

Figure 14A:
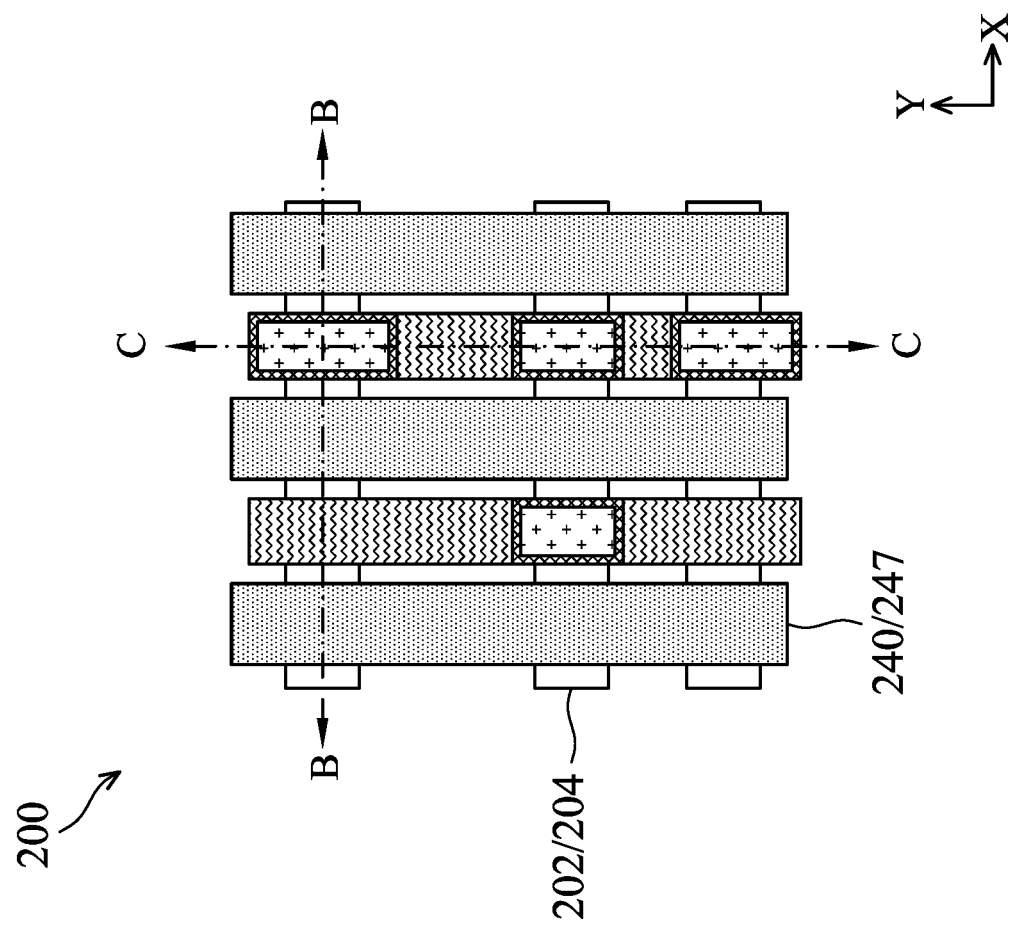
Figure 14B:
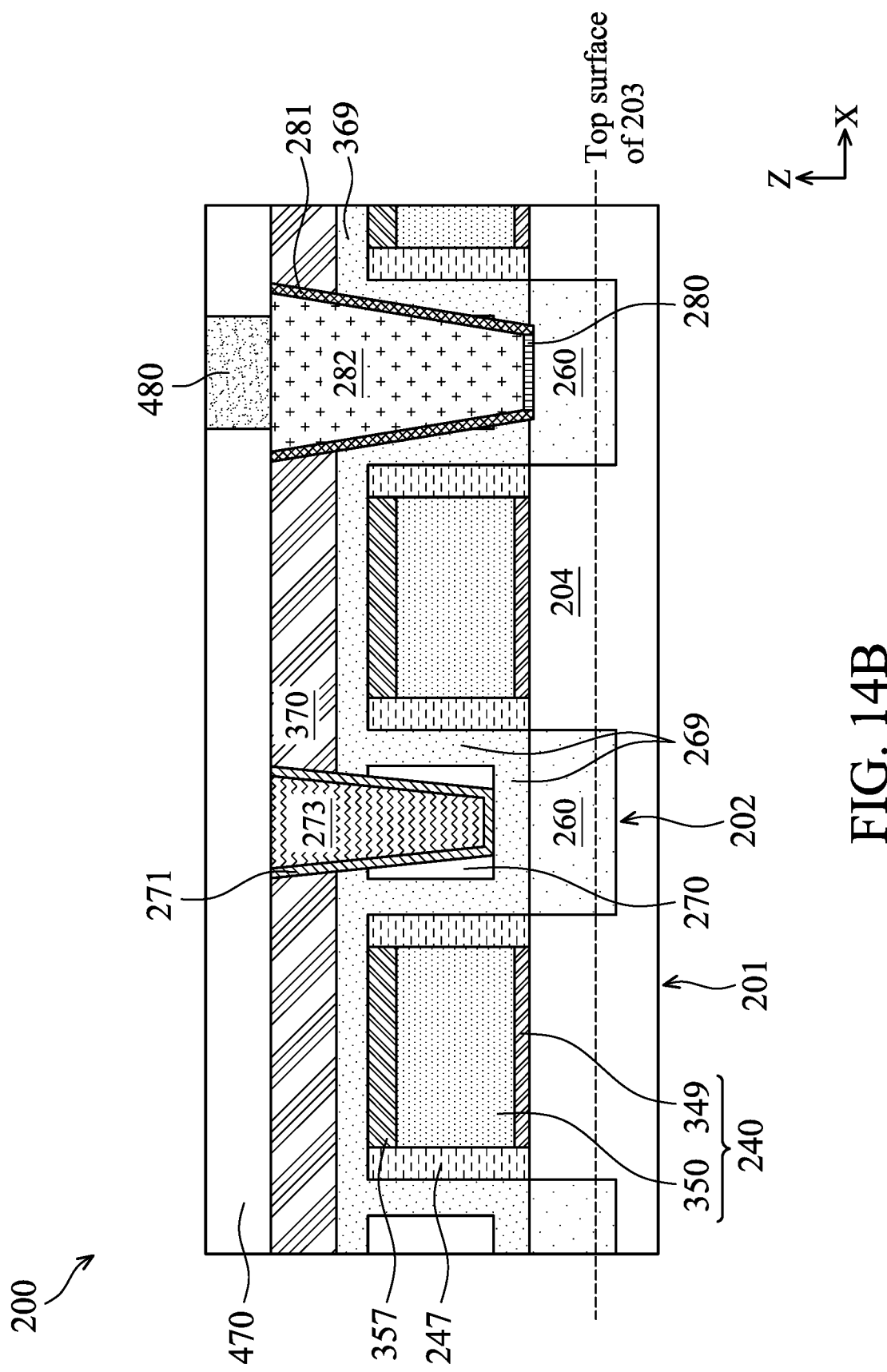
Figure 14C:
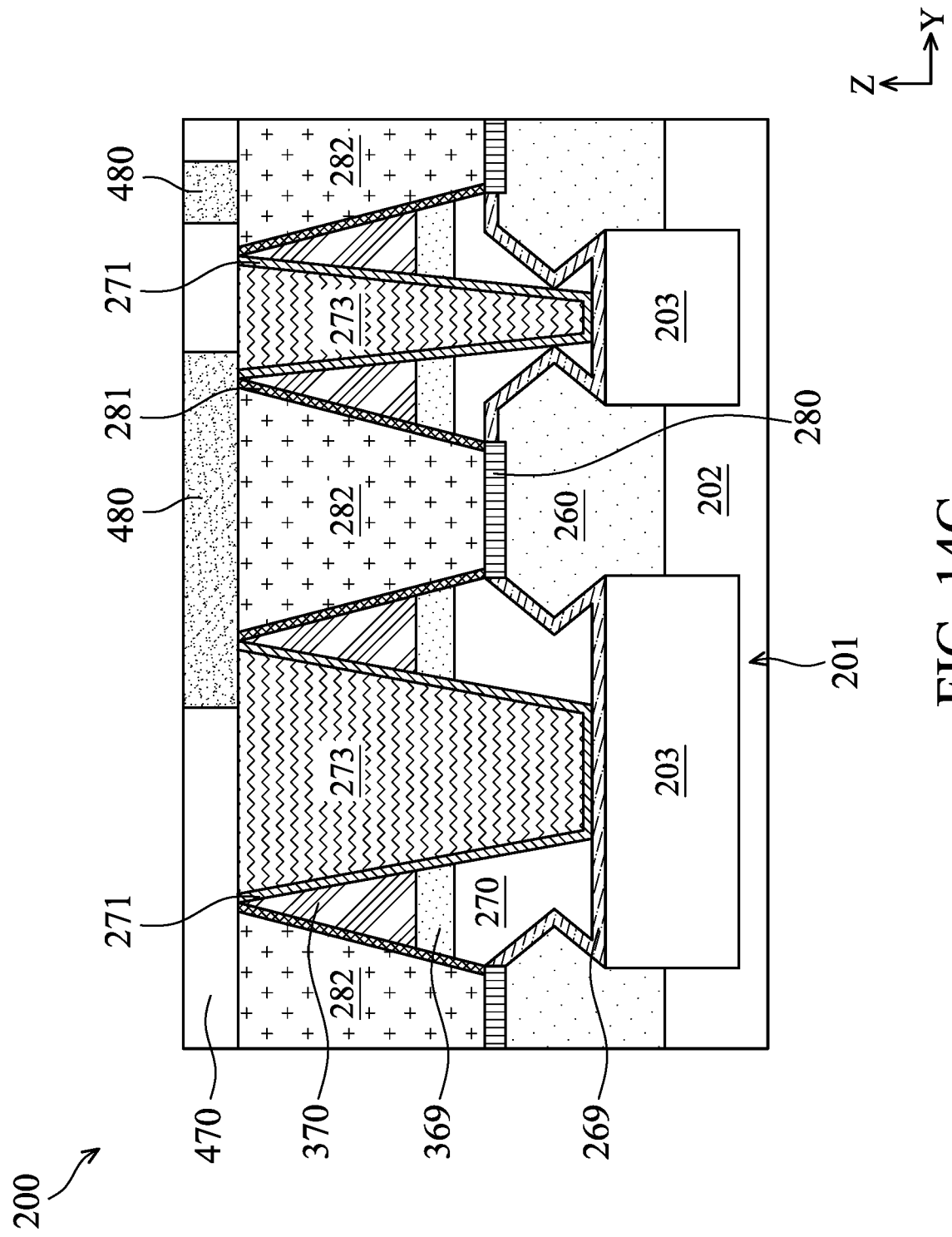
Figure 15:
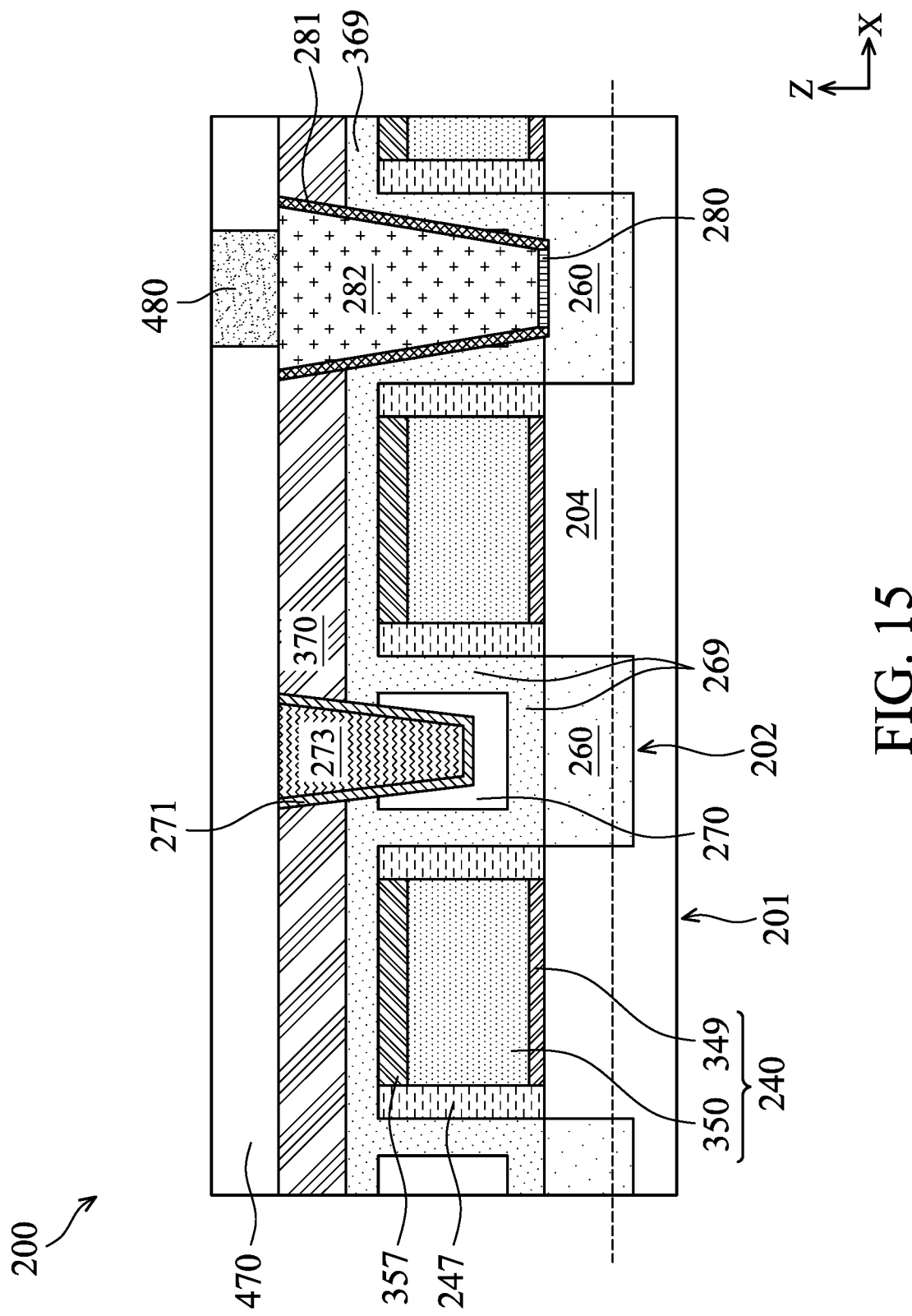
FIGS. 15, 16, and 17 are cross-sectional views of a portion of the semiconductor device along the B-B line of FIG. 2A, during various manufacturing stages according to the method in FIGS. 1A and 1B in accordance with embodiments of the present disclosure.
Figure 16:
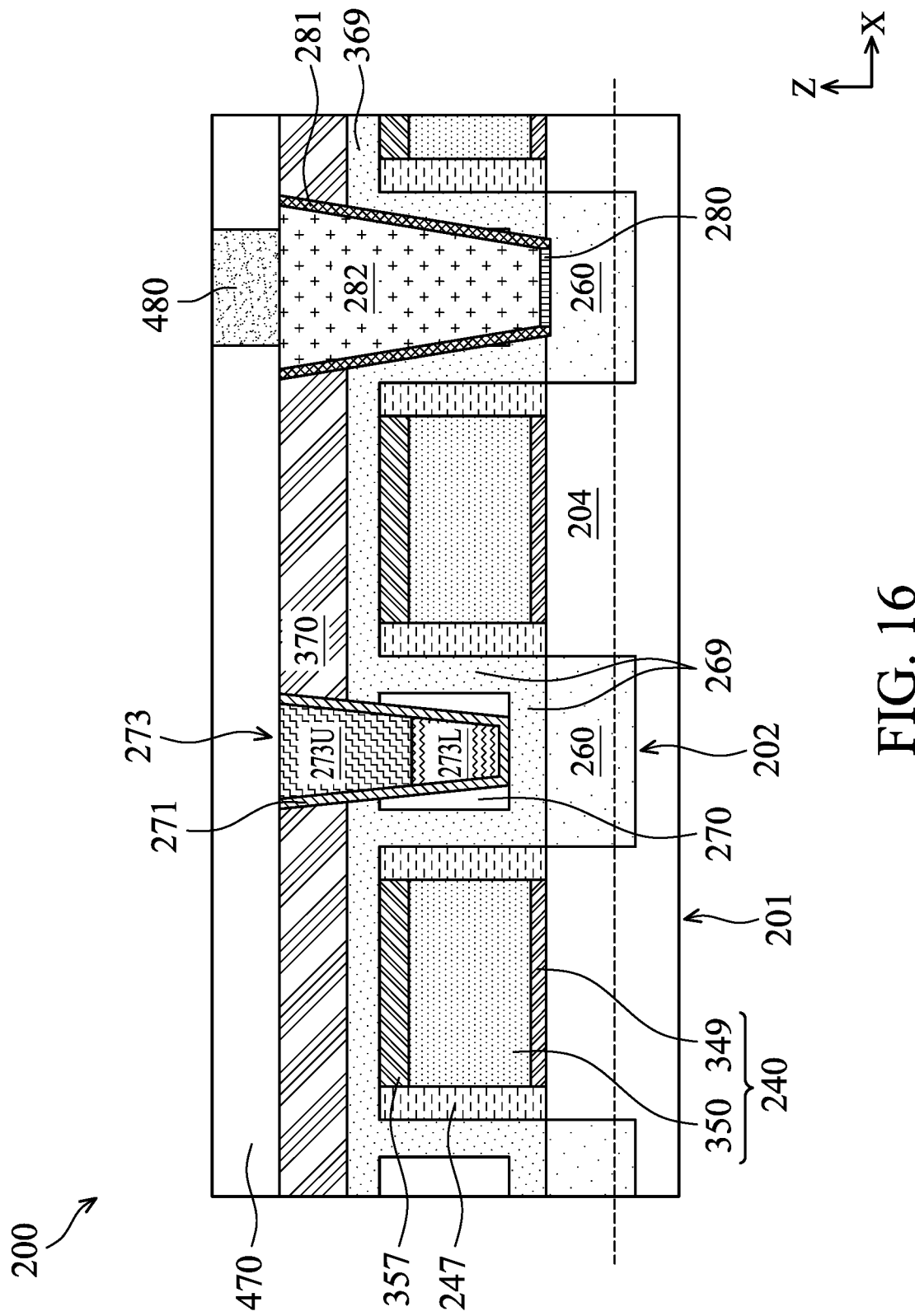
Figure 17:
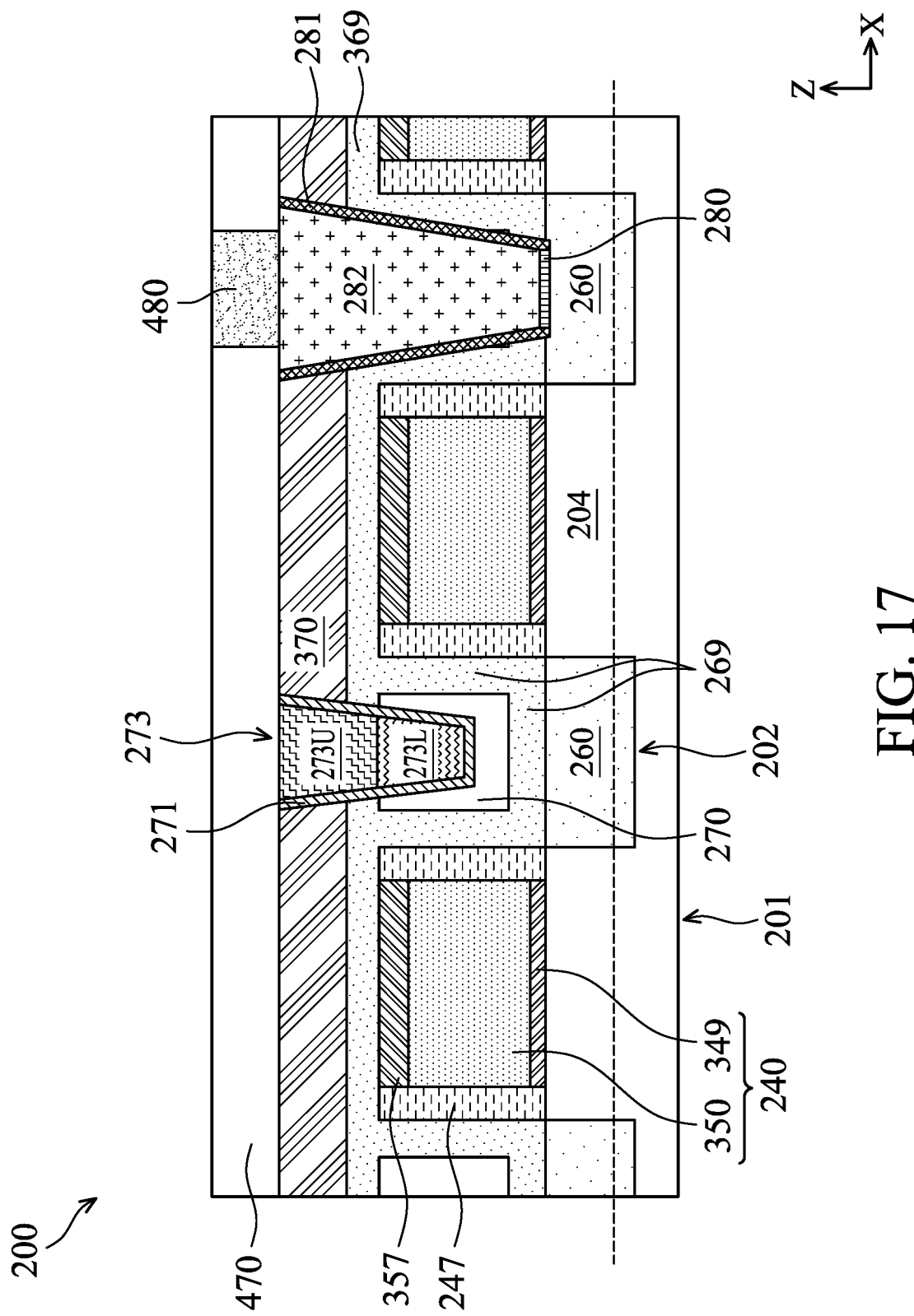

FIGS. 14A-14C illustrate another embodiment of the semiconductor device 200. In this embodiment, the semiconductor device 200 further includes a dielectric liner 271 on sidewalls and bottom of each dielectric plug 273. The dielectric liner 271 may include $Si_3N_4$, SiCN, or other suitable material. In an embodiment, the dielectric liner 271 includes a dielectric material that has a lower dielectric constant (lower k) than the material in the dielectric plug 273. The dielectric liner 271 may help prevent materials of the dielectric plug 273 from migrating to and oxidizing the gate structures 240. In an embodiment, the dielectric liner 271 has a thickness about 1 nm to about 5 nm. Other aspects of this embodiment are the same as those of the embodiment shown in FIGS. 9A-9C (such as the slanted sidewalls and the angles). Further, the dielectric liner 271 may be provided in the embodiments shown in FIGS. 10A-10C, 11A-11C, 12A-12C, 13A-13C, and their variants. Some non-limiting examples are shown in FIGS. 15-17.

Although not intended to be limiting, one or more embodiments of the present disclosure provide many benefits to a semiconductor device and a formation process thereof. For example, embodiments of the present disclosure provide a process for forming S/D contacts. Before the S/D contacts are formed, dielectric plugs are formed that act as separator or isolation between adjacent S/D contacts. During the process of forming contact holes, the dielectric plugs help prevent hard mask peeling issues and mitigate etch loading effects among short and long contacts. The provided subject matter can be readily integrated into existing IC fabrication flow and can be applied to many different process nodes.

In one example aspect, the present disclosure is directed to a method that includes providing a structure having gate structures, source/drain electrodes adjacent to the gate structures, a first etch stop layer over the source/drain electrodes and the gate structures, a first interlayer dielectric layer over the first etch stop layer, a second etch stop layer over the gate structures, the first etch stop layer, and the first interlayer dielectric layer, and a second interlayer dielectric layer on the second etch stop layer. The method further includes forming a first etch mask that provides first openings over the second interlayer dielectric layer and performing a first etching to the second interlayer dielectric layer, the second etch stop layer, and the first interlayer dielectric layer through the first openings, thereby forming first trenches. The method further includes depositing a third dielectric layer into the first trenches, wherein the third dielectric layer has a different material than the second interlayer dielectric layer. The method further includes forming a second etch mask that provides second openings that expose portions of the second interlayer dielectric layer and the third dielectric layer and performing a second etching to the second interlayer dielectric layer, the second etch stop layer, the first interlayer dielectric layer, and the first etch stop layer through the second openings, thereby forming second trenches, wherein the second trenches expose some of the source/drain electrodes, wherein the third dielectric layer resists the second etching. The method further includes depositing a metal layer into the second trenches.

In an embodiment, the method further includes removing the second etch mask before the depositing of the metal layer. In another embodiment, the method further includes forming a third interlayer dielectric layer over the second interlayer dielectric layer, the third dielectric layer, and the metal layer; etching the third interlayer dielectric layer to forming via holes that expose the metal layer; and forming metal vias in the via holes. In a further embodiment, at least one of the metal vias is disposed directly above the third dielectric layer.

In an embodiment of the method, the first etching also etches the first etch stop layer. In another embodiment, the method further includes forming a dielectric liner layer on surfaces of the first trenches before the depositing of the third dielectric layer, wherein the third dielectric layer is deposited on the dielectric liner layer.

In some embodiments of the method, the second interlayer dielectric layer includes $SiO_2$, and the third dielectric layer includes $La_2O_3$, $Al_2O_3$, AlON, $ZrO_2$, $HfO_2$, $Si_3N_4$, ZnO, ZrN, ZrAlO, $TiO_2$, $Ta_2O_5$, $Y_2O_3$, TaCN, SiOCN, SiOC, or SiCN. In some embodiments, the third dielectric layer includes a first sub-layer and a second sub-layer over the first sub-layer, wherein a top surface of the first sub-layer is below a top surface of the second etch stop layer, wherein the first and the second sub-layers include different dielectric materials.

In some embodiments of the method, the structure further includes an isolation structure adjacent to the gate structures and the source/drain electrodes and below the first etch stop layer, wherein the first trenches expose a portion of the isolation structure. In some embodiments, the first trenches expose at least one of the source/drain electrodes.

In another example aspect, the present disclosure is directed to a method that includes providing a structure having semiconductor fins, an isolation structure adjacent to lower portions of the semiconductor fins, source/drain electrodes over the semiconductor fins, gate structures over channel regions of the semiconductor fins, a first etch stop layer on the source/drain electrodes, the isolation structure, and the gate structures, a first interlayer dielectric layer on the first etch stop layer, a second etch stop layer on the gate structures, the first etch stop layer, and the first interlayer dielectric layer, and a second interlayer dielectric layer on the second etch stop layer. The method further includes forming a first etch mask that provides first openings over the second interlayer dielectric layer; performing a first etching to at least the second interlayer dielectric layer, the second etch stop layer, and the first interlayer dielectric layer through the first openings, resulting in first trenches; filling the first trenches with one or more third dielectric layers that have a different material than the second interlayer dielectric layer; forming a second etch mask that provides second openings directly above the second interlayer dielectric layer and the one or more third dielectric layers; performing a second etching to at least the second interlayer dielectric layer, the second etch stop layer, the first interlayer dielectric layer, and the first etch stop layer through the second openings, resulting in second trenches that expose some of the source/drain electrodes, wherein the second etching is tuned not to etch the one or more third dielectric layers; and forming source/drain contact plugs in the second trenches.

In an embodiment, the method further includes removing the first etch mask before the filling of the first trenches with the one or more third dielectric layers.

In another embodiment, the filling of the first trenches with the one or more third dielectric layers includes depositing the one or more third dielectric layers into the first trenches and over the second interlayer dielectric layer and performing a chemical mechanical planarization (CMP) process to the one or more third dielectric layers.

In some embodiments, the one or more third dielectric layers are in direct contact with the first etch stop layer. In some embodiments, the one or more third dielectric layers are in direct contact with the isolation structure.

In yet another example aspect, the present disclosure is directed to a semiconductor structure. The semiconductor structure includes gate structures; source/drain electrodes adjacent to the gate structures; a first etch stop layer over the source/drain electrodes and the gate structures; a first interlayer dielectric layer over the first etch stop layer; a second etch stop layer over the gate structures, the first etch stop layer, and the first interlayer dielectric layer; a second interlayer dielectric layer over the second etch stop layer; first dielectric structures disposed between adjacent ones of the gate structures from a top view and extending vertically from a top surface of the second interlayer dielectric layer to a point within or below the first interlayer dielectric layer; and source/drain contacts extending through the first and the second interlayer dielectric layers and the first and the second etch stop layers and landing on some of the source/drain electrodes.

In some embodiments, the semiconductor structure further includes a third interlayer dielectric layer over the second interlayer dielectric layer, the first dielectric structures, and the source/drain contacts and metal vias in the third interlayer dielectric layer and landing on the source/drain contacts. In a further embodiment, at least one of the metal vias is disposed directly above one of the first dielectric structures.

In some embodiments, the semiconductor structure further includes an isolation structure adjacent to the gate structures and the source/drain electrodes and below the first etch stop layer, wherein one of the first dielectric structures is in direct contact with the isolation structure. In some embodiments, one of the first dielectric structures is in direct contact with one of the source/drain electrodes.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
providing a structure having gate structures, source/drain electrodes adjacent to the gate structures, a first etch stop layer over the source/drain electrodes and the gate structures, a first interlayer dielectric layer over the first etch stop layer, a second etch stop layer over the gate structures, the first etch stop layer, and the first interlayer dielectric layer, and a second interlayer dielectric layer on the second etch stop layer;
forming a first etch mask that provides first openings over the second interlayer dielectric layer;
performing a first etching to the second interlayer dielectric layer, the second etch stop layer, and the first interlayer dielectric layer through the first openings, thereby forming first trenches;
depositing a third dielectric layer into the first trenches, wherein the third dielectric layer has a different material than the second interlayer dielectric layer;
forming a second etch mask that provides second openings that expose portions of the second interlayer dielectric layer and the third dielectric layer;
performing a second etching to the second interlayer dielectric layer, the second etch stop layer, the first interlayer dielectric layer, and the first etch stop layer through the second openings, thereby forming second trenches, wherein the second trenches expose some of the source/drain electrodes, wherein the third dielectric layer resists the second etching; and
depositing a metal layer into the second trenches.
2. The method of claim 1, further comprising:
before the depositing of the metal layer, removing the second etch mask.

3. The method of claim 1, further comprising:
forming a third interlayer dielectric layer over the second interlayer dielectric layer, the third dielectric layer, and the metal layer;
etching the third interlayer dielectric layer to form via holes that expose the metal layer; and
forming metal vias in the via holes.

4. The method of claim 3, wherein at least one of the metal vias is disposed directly above the third dielectric layer.

5. The method of claim 1, wherein the first etching also etches the first etch stop layer.

6. The method of claim 1, further comprising:
before the depositing of the third dielectric layer, forming a dielectric liner layer on surfaces of the first trenches, wherein the third dielectric layer is deposited on the dielectric liner layer.

7. The method of claim 1, wherein the second interlayer dielectric layer includes $SiO_2$, and the third dielectric layer includes $La_2O_3$, $Al_2O_3$, AlON, $ZrO_2$, $HfO_2$, $Si_3N_4$, ZnO, ZrN, ZrAlO, $TiO_2$, $Ta_2O_5$, $Y_2O_3$, TaCN, SiOCN, SiOC, or SiCN.

8. The method of claim 1, wherein the third dielectric layer includes a first sub-layer and a second sub-layer over the first sub-layer, wherein a top surface of the first sub-layer is below a top surface of the second etch stop layer, wherein the first and the second sub-layers include different dielectric materials.

9. The method of claim 1, wherein the structure further includes an isolation structure adjacent to the gate structures and the source/drain electrodes and below the first etch stop layer, wherein the first trenches expose a portion of the isolation structure.

10. The method of claim 1, wherein the first trenches expose at least one of the source/drain electrodes.

11. A method, comprising:
providing a structure having semiconductor fins, an isolation structure adjacent to lower portions of the semiconductor fins, source/drain electrodes over the semiconductor fins, gate structures over channel regions of the semiconductor fins, a first etch stop layer on the source/drain electrodes, the isolation structure, and the gate structures, a first interlayer dielectric layer on the first etch stop layer, a second etch stop layer on the gate structures, the first etch stop layer, and the first interlayer dielectric layer, and a second interlayer dielectric layer on the second etch stop layer;
forming a first etch mask that provides first openings over the second interlayer dielectric layer;
performing a first etching to at least the second interlayer dielectric layer, the second etch stop layer, and the first interlayer dielectric layer through the first openings, resulting in first trenches;
filling the first trenches with one or more third dielectric layers that have a different material than the second interlayer dielectric layer;
forming a second etch mask that provides second openings directly above the second interlayer dielectric layer and the one or more third dielectric layers;
performing a second etching to at least the second interlayer dielectric layer, the second etch stop layer, the first interlayer dielectric layer, and the first etch stop layer through the second openings, resulting in second trenches that expose some of the source/drain electrodes, wherein the second etching is tuned not to etch the one or more third dielectric layers; and
forming source/drain contact plugs in the second trenches.

12. The method of claim 11, further comprising:
removing the first etch mask before the filling of the first trenches with the one or more third dielectric layers.

13. The method of claim 11, wherein the filling of the first trenches with the one or more third dielectric layers includes:
depositing the one or more third dielectric layers into the first trenches and over the second interlayer dielectric layer; and
performing a chemical mechanical planarization (CMP) process to the one or more third dielectric layers.

14. The method of claim 11, wherein the one or more third dielectric layers are in direct contact with the first etch stop layer.

15. The method of claim 11, wherein the one or more third dielectric layers are in direct contact with the isolation structure.

16. A method, comprising:
providing a structure having gate structures, source/drain electrodes adjacent to the gate structures, a first etch stop layer over the source/drain electrodes and the gate structures, a first interlayer dielectric layer over the first etch stop layer, a second etch stop layer over the gate structures, the first etch stop layer, and the first interlayer dielectric layer, and a second interlayer dielectric layer on the second etch stop layer;
forming a first trench that extends through the second interlayer dielectric layer, the second etch stop layer, and the first interlayer dielectric layer;
forming a dielectric structure in the first trench, wherein the dielectric structure has a different material than the second interlayer dielectric layer;
performing a first etching process to form a second trench that extends through the second interlayer dielectric layer, the second etch stop layer, the first interlayer dielectric layer, and the first etch stop layer, wherein the second trench exposes one of the source/drain electrodes, and wherein the dielectric structure resists the first etching process; and
forming a source/drain contact in the second trench.

17. The method of claim 16, wherein the forming of the first trench includes:
forming a first etch mask having an opening over the second interlayer dielectric layer and between adjacent ones of the gate structures, and
performing a second etching process to remove portions of the second interlayer dielectric layer, the second etch stop layer, and the first interlayer dielectric layer through the opening, resulting in the first trench, wherein the first trench exposes a portion of the first interlayer dielectric layer or a portion of the first etch stop layer.

18. The method of claim 16, wherein the forming of the second trench includes forming a second etch mask having an opening that exposes portions of the second interlayer dielectric layer and the dielectric structure, such that performing the first etching process removes portions of the second interlayer dielectric layer, the second etch stop layer, the first interlayer dielectric layer, and the first etch stop layer through the opening, resulting in the second trench, wherein a bottom surface of the second trench is below a bottom surface of the first trench.

19. The method of claim 16, further comprising forming a dielectric liner layer in the first trench before forming the dielectric structure.

20. The method of claim 16, further comprising, before forming the source/drain contact:
  forming a liner on sidewalls of the second trench; and
  forming a silicide layer on a top surface of the exposed one of the source/drain electrodes.

* * * * *